(12) United States Patent
Shchukin et al.

(10) Patent No.: US 7,101,444 B2
(45) Date of Patent: Sep. 5, 2006

(54) DEFECT-FREE SEMICONDUCTOR TEMPLATES FOR EPITAXIAL GROWTH

(75) Inventors: Vitaly Shchukin, Berlin (DE); Nikolai Ledentsov, Berlin (DE)

(73) Assignee: NL Nanosemiconductor GmbH, Dortmund (DE)

(*) Notice: Subject to any disclaimer, the term of this patent is extended or adjusted under 35 U.S.C. 154(b) by 0 days.

(21) Appl. No.: 10/763,461

(22) Filed: Jan. 23, 2004

(65) Prior Publication Data

US 2004/0150001 A1 Aug. 5, 2004

Related U.S. Application Data

(60) Division of application No. 10/456,377, filed on Jun. 6, 2003, now Pat. No. 6,784,074, which is a continuation-in-part of application No. 09/851,730, filed on May 9, 2001, now Pat. No. 6,653,166.

(51) Int. Cl.
*H01L 29/00* (2006.01)

(52) U.S. Cl. .............................. 148/33; 257/14; 257/17; 257/200; 257/190

(58) Field of Classification Search .................. 257/14, 257/21, 85, 12, 94, 190, 200, E33.005, E33.021, 257/E33.023, E33.025, E33.043; 148/33
See application file for complete search history.

(56) References Cited

U.S. PATENT DOCUMENTS

| | | | |
|---|---|---|---|
| 4,806,996 A | 2/1989 | Luryi | 357/16 |
| 4,952,526 A | 8/1990 | Pribat et al. | 438/412 |
| 5,019,874 A | 5/1991 | Inoue et al. | 357/16 |
| 5,075,744 A | 12/1991 | Tsui | 357/22 |
| 5,091,767 A | 2/1992 | Bean et al. | 357/60 |
| 5,156,995 A | 10/1992 | Fitzgerald, Jr. et al. | 437/90 |
| 5,208,182 A | 5/1993 | Narayan et al. | 437/110 |
| 5,210,051 A | 5/1993 | Carter, Jr. | 437/107 |
| 5,221,367 A * | 6/1993 | Chisholm et al. | 148/33 |
| 5,290,393 A | 3/1994 | Nakamura | 156/613 |
| 5,306,662 A | 4/1994 | Nakamura et al. | 437/107 |
| 5,482,890 A | 1/1996 | Liu et al. | 437/107 |
| 5,633,516 A | 5/1997 | Mishima et al. | 257/190 |

(Continued)

FOREIGN PATENT DOCUMENTS

WO    WO02/13273    2/2002

OTHER PUBLICATIONS

J.L. Liu, C.D. Moore, G.D. U'Ren, Y.H. Luo, Y. Lu, G. Lin, S.G. Thomas, M.S. Goorsky, K.L. Wang; "*A surfactant-mediated relaxed Sio.5Geo.5 graded layer with a very low threading dislocation density and smooth surface*", Appliedd Physics Letters, vol. 75 (11), pp. 1586-1588 (1999).

(Continued)

*Primary Examiner*—George Fourson
*Assistant Examiner*—Julio J. Maldonado
(74) *Attorney, Agent, or Firm*—Brown & Michaels, PC

(57) ABSTRACT

A semiconductor device includes at least one defect-free epitaxial layer. At least a part of the device is manufactured by a method of fabrication of defect-free epitaxial layers on top of a surface of a first solid state material having a first thermal evaporation rate and a plurality of defects, where the surface comprises at least one defect-free surface region, and at least one surface region in a vicinity of the defects, the method including the steps of selective deposition of a second material, having a high temperature stability, on defect-free regions of the first solid state material, followed by subsequent evaporation of the regions in the vicinity of the defects, and subsequent overgrowth by a third material forming a defect-free layer.

42 Claims, 10 Drawing Sheets

U.S. PATENT DOCUMENTS

| | | | |
|---|---|---|---|
| 5,719,894 A | 2/1998 | Jewell et al. | 372/45 |
| 5,741,724 A | 4/1998 | Ramdani et al. | 437/182 |
| 5,838,029 A | 11/1998 | Shakuda | 257/190 |
| 5,859,864 A | 1/1999 | Jewell | 372/45 |
| 5,888,885 A | 3/1999 | Xie | 438/493 |
| 5,927,995 A | 7/1999 | Chen et al. | 438/517 |
| 5,928,421 A | 7/1999 | Yuri et al. | 117/97 |
| 5,960,018 A | 9/1999 | Jewell et al. | 372/45 |
| 5,972,801 A | 10/1999 | Lipken et al. | 438/770 |
| 6,087,681 A | 7/2000 | Shakuda | 257/103 |
| 6,153,010 A | 11/2000 | Kiyoku et al. | 117/95 |
| 6,160,833 A | 12/2000 | Floyd et al. | 372/45 |
| 6,177,688 B1 | 1/2001 | Linthicum et al. | 257/77 |
| 6,184,144 B1 * | 2/2001 | Lo | 438/703 |
| 6,194,742 B1 | 2/2001 | Kern et al. | 257/94 |
| 6,225,650 B1 | 5/2001 | Tadatomo et al. | 257/190 |
| 6,287,947 B1 | 9/2001 | Ludowise et al. | 438/606 |
| 6,498,111 B1 | 12/2002 | Kapolnek et al. | 438/762 |
| 6,534,797 B1 | 3/2003 | Edmond et al. | 257/97 |
| 6,537,513 B1 | 3/2003 | Amano et al. | 423/328.2 |
| 6,582,986 B1 | 6/2003 | Kong et al. | 438/48 |
| 6,602,763 B1 | 8/2003 | Davis et al. | 438/481 |
| 6,627,520 B1 | 9/2003 | Kozaki et al. | 438/479 |
| 6,627,974 B1 | 9/2003 | Kozaki et al. | 257/623 |
| 6,630,691 B1 | 10/2003 | Mueller-Mach et al. | 257/84 |
| 6,630,692 B1 | 10/2003 | Goetz et al. | 257/94 |
| 2002/0046693 A1 | 4/2002 | Kiyoku et al. | 117/8 |
| 2002/0052084 A1 | 5/2002 | Fitzgerald | 438/282 |
| 2003/0037722 A1 | 2/2003 | Kiyoku et al. | 117/84 |
| 2003/0160232 A1 | 8/2003 | Kozaki et al. | 257/22 |

OTHER PUBLICATIONS

Y. Takano, K. Kobayashi, H. Iwahori, N. Kuwahara, S. Fuke, S. Shirakata; "*Low temperature growth of InGaAs layers on misoriented GaAs substrates by metalorganic vapor phase epitaxy*", Applied Physics Letters, vol. 80 (12), pp. 2054-2056 (2002).

M.J. Manfra, N.G. Weimann, J.W.P. Hsu, L.N. Pfeiffer, K.W. West, S.N.G. Chu; "Dislocation and morphology control during molecular-beam epitaxy of AlGaN/GaN heterostructures directly on sapphire substrates"; Applied Physics Letters 81 (8), pp. 1456-1458 (2002).

O. Conteras, F.A. Ponce, J. Christen, A. Dadgar, A. Krost; "*Dislocation annihilation by silicon delta-doping in GaN epitaxy on Si*"; Applied Physics Letters 81 (25), pp. 4712-4714 (2002).

A.D. Capewell, T.J. Grasby, T.E. Whall, E.H.C. Parker; "*Terrace grading of SiGe for high quality virtual substrates*"; Applied Physics Letters 81 (25), pp. 4775-4777 (2002).

"*Vertical-Cavity Surface-Emitting Lasers: Design, Fabrication, Characterization, and Applications*"; by C.W. Wilmsen, H. Temkin, L.A. Coldren (editors), Cambridge University Press, 1999.

N.N. Ledentsov, V.A. Shchukin; "*Novel Concepts for Injection Lasers*", Optical Engineering, vol. 41 (12), pp. 3193-3203 (2002).

N.N. Ledentsov et al., "1.3 um Luminescence and Gain From Defect-Free InGaAs-GaAs Quantum Dots Grown By Metal-Organic Chemical Vapor Deposition." Semicond. Sci. Technol. 15, 2000, pp. 604-607.

Scott A. McHugo and William D. Sawyer Impurity decoration of defects in float zone and polycrystalline silicon via chemomechanical polishing Applied Physics Letters (1993) vol. 62, Issue 20, pp. 2519-2521.

B. Shen, X. Y. Zhang, K. Yang, P. Chen, R. Zhang, Y. Shi, Y. D. Zheng, T. Sekiguchi and K. Sumino Gettering of Fe impurities by bulk stacking faults in Czochralski-grown silicon Applied Physics Letters (1997) vol. 70, Issue 14, pp. 1876-1878.

M. Herrera Zaldivar, P. Fernandez, and J. Pique Study of defects in GaN films by cross-sectional cathodoluminescence Journal of Applied Physics (1998) -vol. 83, Issue 5, pp. 2796-2799.

Ledentsov, N. N. "Long-Wavelenght Quantum-Dot Lasers on GaAs substrates: From Media to Device Concepts" IEEE Journal of Selected Topics in Quantum Electronics, vol. 8, No. 5, Sep./Oct. 2002 pp. 1015-1024.

Chen, Y. et al, 1995, "Nucleation of misfit dislocations in Ino. 2Gao.8 As epilayers grown on GaAs substrates", Appl. Phys. Lett 66 (4) 499-501.

Huffaker, D.L. et al, 1998, "1.3 µm room-temperature GaAs-based quantum-dot laser", Appl Phys. Lett. 73 918), pp. 2563-3566.

Blum, O. et al, 2000, "Characteristics of GaAsSb Single-Quantum-Well-Lasers Emitting Near 1.3 µm", IEEE Photonics Technology Letters, vol. 12, No. 7, pp. 771-773.

Nakahara, K. et al, 1998, "1.3 µm, Continuous-Wave Lasing Operation in GaIaNAs Quantum-Well Lasers", IEEE Photonics Technology Letters, vol. 10, No. 4, pp. 487-488.

Schlenker, D. et al, 1999, "1.17 µm Highly Strained GaIaAs-GaAs Quantum-Well Laser", IEEE Photonics Technology Letters, vol. 11, No. 8, pp. 946-948.

Lee, B. et al, 1996, "Optical properties of InGaAs linear graded buffer layers on GaAs grown by metalorganic chemical vapor deposition" Appl. Phys. Lett. 68 (21), pp. 2973-2975.

Roan, E.J. et al, 1991, Long-wavelenght (1.3 µm) luminescence in InGaAs strained quantum-well structures.

Krestinikov, I. L, Cherkashin, N. A., Sizov, D. S., Bedarev, D. A., Kochnev, I. V., Lantratov, V. M. and Ledentsov, N. N., "InGaAs nanodomains formed in situ on the surface of (Al, Ga)As" Technical Physics Letters, vol. 27, No. 3, Mar. 2001, p. 233-235.

Herman, M.A. et al, 1991, "Heterointerfaces in quantum wells and epitaxial growth processes: Evaluation by luminescence techniques" J. Appl. Phys. 70 (2), pp. 52.

Elman, B. et al, 1989, "In situ measurements of critical layer thickness and optical studies of InGaAs quantum wells grown on GaAs substrates", Appl. Phys. Letter. 55 (16), pp. 1659-1661.

Alferov. Zh. et al, 1971, "Investigation of the Influence of the AlAs-GaAs Heterostructure Parameters on the Laser Threshold Current and The Realization of Continuous Emission at Room Temperature", Soviet Physics—Semiconductors, vol. 4, No. 9, pp. 1573-1575.

Alferov, Zh. et al, 1970, "AlAs—GaAs Heterojunction Injection Lasers With A Low Room-Temperature Threshold", Soviet Physics—Semiconductors, vol. 3, No. 9, pp. 1107-1110.

Gourley, P.L. et al, 1988, "Controversy of Critical Layer Thickness for InGaAs/GaAs strained-layer Epitaxy", Appl. Phys. Lett. 52 (5), pp. 377-379.

Tsang, W.T., 1981, "Extension of lasing wavelenghts beyond 0.87 µm in GaAs/AlxGa1-xAs double-heterostructure lasers by In incorporation in the GaAs active layers during molecular beam epitaxy", Appl. Phys. Lett. 38 (9), pp. 661-663.

Hayashi, I. et al, 1970, "Junction Lasers which Operate Continuously At Room Temperature", Applied Physics Letters, vol. 17, No. 3, pp. 109-111.

Goldstein, L. et al, 1985, "Growth by molecular beam epitaxy and characterization of InAs/GaAs strained-layer superlattices", Appl. Phys. Lett. 47 (10), pp. 1099-1101.

Beanland, R. et al, 1997, "Relaxation of strained epitaxial layers by dislocation rotation, reaction and generation during annealing", Inst. Phys. Conf. Ser. No. 157, pp. 145-148.

Glas, F. et al, 1987, "TEM study of the molecular beam epitaxy island growth of InAs on GaAs", Inst. Phys. Conf. Ser. No. 87: Section 2, pp. 71-76.

* cited by examiner

DEFECT-FREE SEMICONDUCTOR TEMPLATES FOR EPITAXIAL GROWTH

REFERENCE TO RELATED APPLICATIONS

This is a divisional of U.S. patent application Ser. No. 10/456,377, filed Jun. 6, 2003 now U.S. Pat. No. 6,784,074, entitled DEFECT-FREE SEMICONDUCTOR TEMPLATES FOR EPITAXIAL GROWTH AND METHOD FOR MAKING SAME, which is a continuation-in-part of U.S. patent application Ser. No. 09/851,730, filed May 9, 2001, entitled "SEMICONDUCTOR DEVICE AND METHOD OF MAKING SAME", now U.S. Pat. No. 6,653,166. The aforementioned applications are hereby incorporated herein by reference.

BACKGROUND OF THE INVENTION

1. Field of the Invention

The invention pertains to the field of semiconductor devices. More particularly, the invention pertains to fabricating defect-free epitaxial layers for semiconductor device applications.

2. Description of Related Art

Propagating defects, including threading dislocations, screw dislocations, stacking faults, and antiphase boundaries, play a negative role in semiconductor devices, often limiting or even ruining their performance. Propagating defects can act as strong scattering centers for carriers, thus reducing their mobility and limiting the performance of many semiconductor devices. Some of these devices include heterojunction bipolar transistors (HBT), field effect transistors (FET), and high electron mobility transistors (HEMT). Propagating defects can also act as centers of non-radiative recombination, thus ruining performance of light-emitting devices like light emitting diodes (LED), optical amplifiers, and semiconductor diode lasers. During device operation, particularly at elevated temperatures or at high power of light, defects can propagate through the device structure and multiply themselves, thus reducing the operating lifetime of the device.

Some reasons for the extended defects in a semiconductor heterostructure include, but are not limited to:

lattice mismatch between an epilayer and a substrate (for example in the case of an epilayer having a thickness exceeding the critical thickness against plastic relaxation);

precipitates of point defects and impurities (in the substrates);

statistical irregularities during crystal growth (in both the substrate and the epilayer);

dirt on the substrate surface (generating defects in the epilayer);

nucleation of surface defects (for example "oval defects" in molecular beam epitaxy) due to local surface oxidation or statistical formation of droplets of source materials at the growth surface; and difference in thermal expansion coefficients between the substrate and the epilayer.

Several approaches have been proposed to reduce the density of dislocations and other defects in epitaxial layers.

Liu et al. proposed the use of Sb as a surfactant during the growth of $Si_{0.5}Ge_{0.5}$ on Si by molecular beam epitaxy in order to reduce the density of threading dislocations ("*A surfactant-mediated relaxed $Si_{0.5}Ge_{0.5}$ graded layer with a very low threading dislocation density and smooth surface*", Applied Physics Letters, 75 (11), 1586–1588 (1999)).

Takano et al. used low temperature growth of InGaAs layers on misoriented GaAs substrates by metalorganic vapor phase epitaxy aimed to reduce the density of non-radiative recombination centers and improve the photoluminescence properties of the layers ("Low temperature growth of InGaAs layers on misoriented GaAs substrates by metalorganic vapor phase epitaxy", Applied Physics Letters, 80 (12), 2054–2056 (2002)).

Manfra et al. used a double-stage growth of a GaN buffer layer in the growth of AlN/GaAlN heterostructures on a sapphire substrate by plasma-assisted molecular beam epitaxy, attempting simultaneous optimization of threading dislocation density and surface morphology ("*Dislocation and morphology control during molecular-beam epitaxy of AlGaN/GaN heterostructures directly on sapphire substrates*", Applied Physics Letters 81 (8), 1456–1458 (2002)). Nitrogen stabilized conditions were used in the first step, which resulted in a roughened, three-dimensional growth morphology. This morphology appeared to increase dislocation interaction and thus, reduced the number of dislocations, which propagated to the surface. Metal stabilized growth conditions were applied in the second step, which resulted in smoothening of the growth surface.

Contreras et al. used Si delta-doping in the epitaxial growth of GaN on a Si (111) substrate by metalorganic chemical vapor deposition ("*Dislocation annihilation by silicon delta-doping in GaN epitaxy on Si*", Applied Physics Letters 81 (25), 4712–4714 (2002)). This led to bending of screw dislocations and "pairing" with equivalent neighboring dislocations with opposite Burgers vectors. This resulted in the formation of square dislocation loops. However, edge dislocations remained unaffected by silicon delta-doping.

Capewell et al. used the terrace grading profile to produce SiGe virtual substrates. ("*Terrace grading of SiGe for high quality virtual substrates*", Applied Physics Letters 81 (25), 4775–4777 (2002)).

However, none of these approaches have been very cost-effective or successful in reducing dislocations sufficiently to create a defect-free epitaxial layer.

There is a need in the art for an improved method for selective etching off of defect-rich regions and application of this method to different materials systems and different semiconductor devices.

SUMMARY OF THE INVENTION

A method for fabrication of defect-free epitaxial layers on top of a surface of a first defect-containing solid state material includes the steps of selective deposition of a second material, having a high temperature stability, on defect-free regions of the first solid state material, followed by subsequent evaporation of the regions in the vicinity of the defects, and subsequent overgrowth by a third material, thus forming a defect-free layer.

DETAILED DESCRIPTION OF THE INVENTION

The current invention overcomes the shortcomings of the prior art with an improved method for selective etching off of defect-rich regions and application of the method to different materials systems and different semiconductor devices.

One method to eliminate defects in epitaxial layers deposits a temperature stable material, which does not cover the regions in the vicinity of the defects. After thermal treatment, the regions near the defects were evaporated. A mechanism for the selective repulsion of the cap material with respect to the defect regions is additionally disclosed. This is elastic repulsion due to different lattice constants in local plastically-relaxed regions in the vicinity of the dislocation in the epilayer and the cap layer, which has a lattice parameter in no-strain state close to that on the surface of the defect-free regions of the epilayer.

Figure 9:
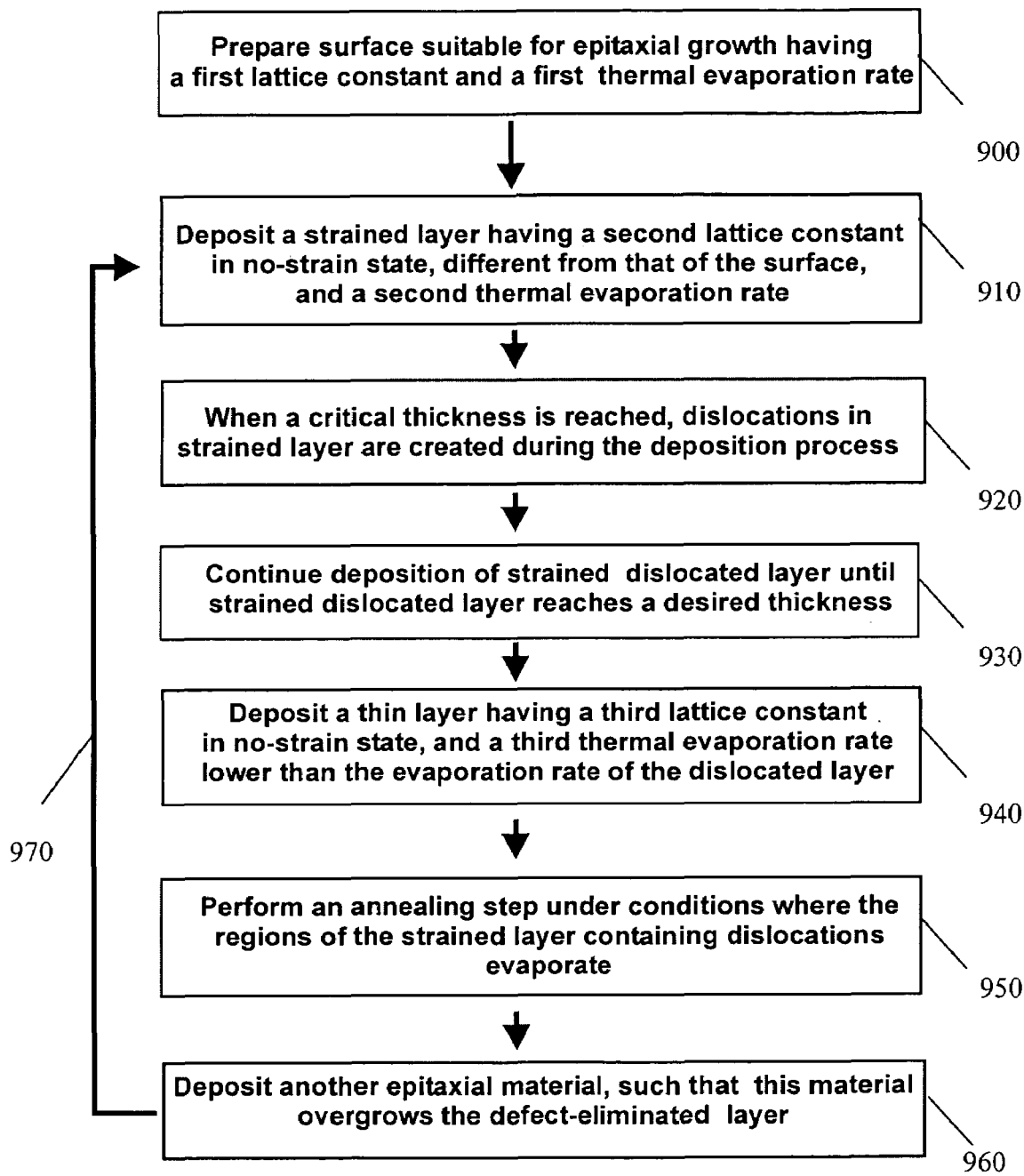
FIG. 9 shows a flowchart of a method of in-situ fabrication of dislocation-free structures from plastically relaxed layers grown on a semiconductor surface suitable for epitaxial growth.
Figure 10:
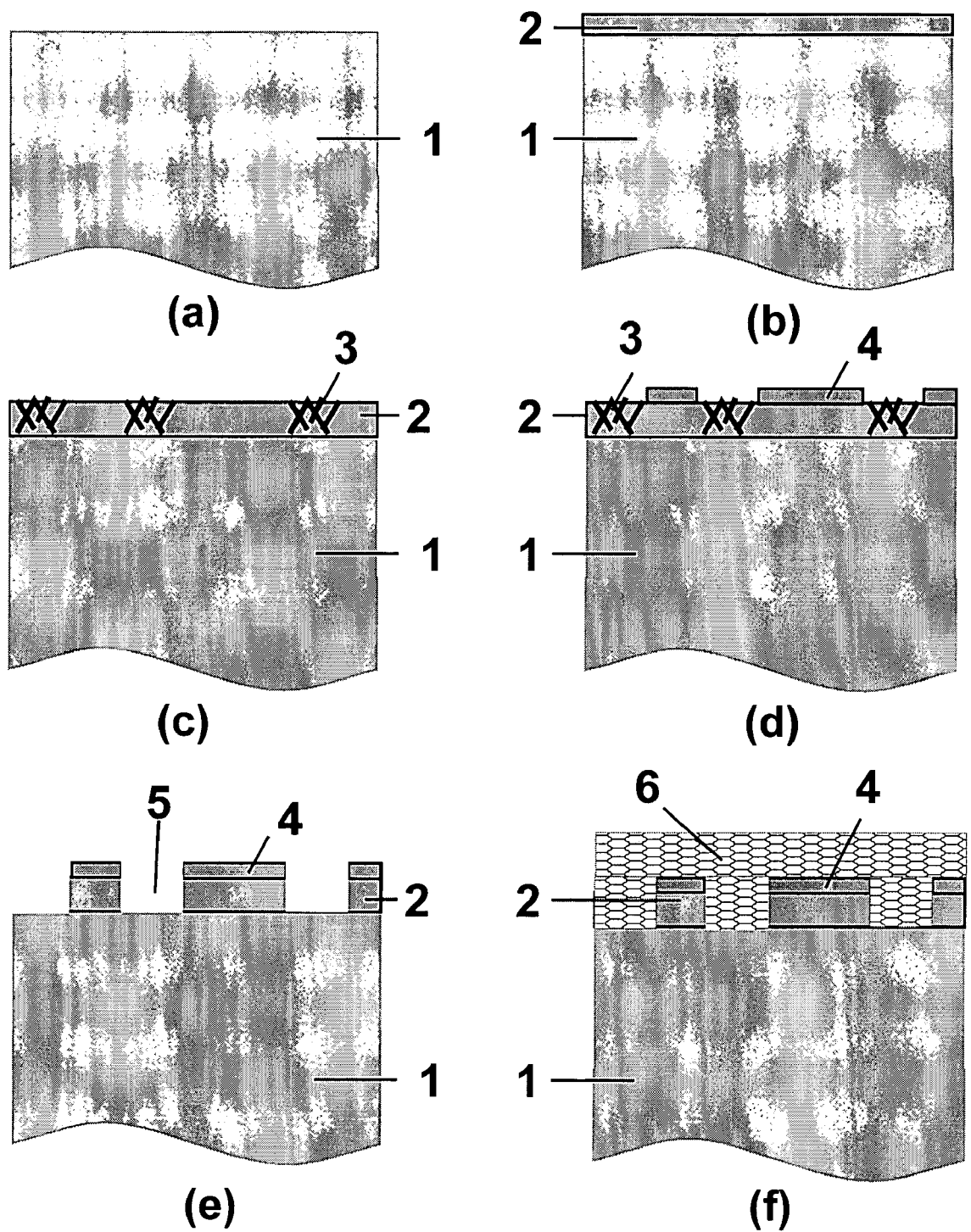
FIG. 10(a) shows a substrate, or an epitaxial layer grown on top of some substrate, with a surface suitable for further epitaxial growth according to the method shown in FIG. 9.
FIG. 10(b) shows FIG. 10(a) after beginning deposition of a lattice-mismatched layer according to the method shown in FIG. 9.
FIG. 10(c) shows FIG. 10(b) after the strain has caused appearance of dislocations and local defects, at some critical thickness, in the lattice-mismatched layer according to the method shown in FIG. 9.
FIG. 10(d) shows FIG. 10(c) after a cap layer has been deposited on top of the lattice-mismatched layer of the device in a preferred embodiment of the invention.
FIG. 10(e) shows FIG. 10(d) after a high temperature-annealing step has been performed.
FIG. 10(f) shows FIG. 10(e) after further overgrowth of the defect eliminated layer regions by an additional layer of the material having a similar lattice constant with the substrate.

Referring to FIGS. 9 and 10, the method of in-situ fabrication of dislocation-free structures from plastically relaxed layers grown on a semiconductor surface suitable for epitaxial growth (disclosed in U.S. patent application Ser. No. 09/851,730) is based on essentially several effects. In step (900), a crystal surface based on material (1) suitable for epitaxial growth is prepared, as it is shown in FIG. 10(a). The crystal surface of material (1) is preferably composed of GaAs, or other III-V, II-VI compound semiconductors or their alloys, or elemental group IV semiconductors and their alloys, or oxides (e.g. $Al_2O_3$). The crystal surface has a first lattice constant in no-strain case. No strain state can be realized in bulk material or in freely suspended film and the lattice parameters of all the relevant materials in no-strain state are available in the prior art.

In step (910), a lattice mismatched layer (2), which has a second lattice constant in no-strain case, is grown on top of the surface material (1), resulting in the intermediate device shown in FIG. 10(b). The lattice-mismatched layer (2) is preferably composed of group III-V, or II-VI compound semiconductor or SiGe material, epitaxially grown on generally the whole area of the initial surface (1), wherein the lattice constant of the lattice-mismatched layer (2) in no-strain state differs from a lattice constant of the initial surface (1). The growth initially proceeds pseudomorphically, and the lateral lattice parameter of the grown film is equal to the lattice constant of the surface. At this stage, significant strain energy accumulates in the lattice-mismatched layer (2) because the second lattice constant differs from the lattice constant of the substrate material (1). At some critical thickness, the strain energy results in partial plastic relaxation of the lattice-mismatched layer (2) via formation of dislocations (4), such as dislocation networks, local defects, and dislocated three-dimensional clusters in step (920). These dislocations (3) are shown in FIG. 10(c). Deposition of the lattice-mismatched dislocated layer (2) continues until it reaches a desired thickness in step (130). The dislocated layer (2) may have a corrugated surface, and/or represent a compositionally modulated internal structure.

During steps (910) through (930), the lattice-mismatched layer (2) is preferably formed by supplying source materials of group III and V elements, group II and VI elements, or group IV elements, constituting group Ill-V compound semiconductor, or II-VI semiconductor, or group IV semiconductor materials, to a reaction chamber. Then, a thin layer of semiconductor material is initially formed and each element is supplied during a defined time period. The total thickness of the dislocated layer (2) exceeds the critical thickness necessary for dislocation (3) formation. Some examples of growth techniques, which could be employed, are molecular beam epitaxy, metal-organic chemical vapor deposition, or related growth techniques. Steps (900) through (930) are optionally repeated, preferably from two times to twenty four times.

After the desired average thickness of the dislocated layer (2) is achieved, a cap layer (4) with a third lattice constant in no-strain case is deposited in step (940). The third lattice constant is preferably close to the lattice constant of the initial surface, or, at least, it should be closer to the initial surface (1) lattice constant, than to the dislocated layer (2) lattice constant in no-strain case, or the lattice mismatch of the cap layer in no strain-state with the initial surface has another sign as the lattice mismatch of the dislocated layer in no-strain case and the initial surface. The temperature during the growth of the cap layer (4) allows migration of atoms of the material of the cap layer (4) towards the energetically-favorable cites. As a result of these conditions, the areas of the dislocated layer (2) near the dislocations (3) are initially not covered by the cap layer (4). The lattice constant in these regions is close to that of the dislocated layer (3) in no-strain state, and these regions are less energetically favorable for nucleation of the cap layer (4) having no, or small lattice mismatch with the semiconductor surface in no-strain state, or the lattice mismatch of the cap layer (4) with the semiconductor surface in no-strain state is of the opposite sign. The total thickness of the layer is kept in such a way that the driven of the cap material leaves the areas of the dislocated layer (2) near the dislocations (3) open. The thermal evaporation rate of the cap layer (4) is preferably lower than that of the dislocated layer (2). The thermal evaporation rate of the initial surface (1) is preferably lower than that of the cap layer (4).

The substrate (1) temperature during epitaxial growth is generally sufficient for adatoms of semiconductor materials, which are present on the surface in some concentrations at elevated temperatures, to diffuse to energetically favorable sites, resulting in redistribution of the cap layer (4) during or after epitaxial deposition. As the third lattice constant is preferably close to that of the substrate (1), the cap layer (4) deposition preferably concentrates away from the regions of the dislocated layer (2) in the vicinity of dislocations (3) and/or local defects, as the lattice constant in these regions is close to the second lattice constant, and the cap layer (4) deposit is more strained when formed in these regions. Thus, the regions of the dislocated layer (2) in the vicinity of dislocations (3) are preferably not covered. A preferable distribution of the cap layer (4) is shown in FIG. 10(d).

The cap layer (4) is preferably composed of group III-V, or II-IV compound semiconductor, or SiGe. However, the cap layer (4) preferably has a different composition ratio of constituent elements from the dislocated layer (2). The cap layer (4) preferably has a similar lattice constant as the initial surface material (1) in the no-strain state. Alternatively, the lattice constants of the cap layer (4) in no-strain state differs from a lattice constant of the initial surface (1), but the difference between the lattice constant of the cap layer (4) in no-strain state and the lattice constant of the initial surface (1) is smaller than the difference between the lattice constant of the dislocated layer (2) in no-strain state and the lattice constant of the initial surface. In a third embodiment, the lattice mismatch of the cap layer (4) with the initial surface (1) in no-strain state is preferably of the opposite sign as the lattice mismatch of the dislocated layer (2) and the initial surface (1) in no-strain state.

After the cap layer (4) is deposited, the substrate temperature is increased up to a temperature where the evaporation of the dislocated layer (2) becomes significant in step (950). The regions containing dislocations and local defects (3), which are not covered by the cap layer (4), are selectively etched-off. The regions of the dislocated layer (2) capped by the cap layer (4) remain on the surface. The resulting structure, shown in FIG. 10(e), represents an array of regions of the defect eliminated layer (2') covered by the cap layer (4) and separated by trenches (5), having a width defined by the etching time and temperature.

The etching time is preferably chosen so that thermal etching results in complete evaporation of defects. In one embodiment reduction of the lateral size of the regions of the dislocated layer (2) to approximately 20–100 nm occurs.

In this case the top regions of the lattice-mismatched defect-eliminated layer may relax elastically via lateral extension into the trenches. The strain distribution becomes non-uniform along the height of the regions of the defect-eliminated layer, and the regions near the initial surface accumulate the highest strain energy. This etching scenario results in preferential etching of the defect-eliminated layer (2') near the interface with the initial surface (1) due to the higher residual strain in this region, thus leading to a mushroom-type pedestals for further epitaxial growth. Alternatively, the etching temperature and time are chosen so that thermal etching of the regions of the defect-eliminated layer (2) results in evaporation of a significant part of this layer (2').

In a third embodiment, the annealing step is performed at temperatures sufficient for dislocation (3) multiplication. The domains in this embodiment are preferably 20–100 nm.

In an alternative embodiment, the dislocated layer (2) is deposited using a composition of source materials under certain conditions and growth sequences to realize a region where the plastic relaxation occurs via local formation of defect dipoles, dislocated clusters, or other local defects, affecting in their vicinity the in-plane lattice parameter of the semiconductor material formed in this step. In this embodiment, step (940) and step (950) result in local holes in the defect eliminated layer (2').

In step (960), an additional layer (6) made of the material as the initial surface is deposited on the device, so that it overgrows the cap layer (4). The resulting structure is shown in FIG. 10(*f*). Alternatively, the additional layer (6) is not identical to the initial surface material (1), but has a lattice constant close to the lattice constant of the initial surface material (1), and is grown or the defect-free-regions are used as templates for further epitaxial growth of semiconductor material having an arbitrary lattice parameter. In both situations, the growth is accomplished according to the desired geometry of a practical device. The additional layer (6) is preferably composed of group III-V or II-VI compound semiconductor or SiGe, or multilayer structure. Steps (910) through (960) are preferably repeated in step (970) two to forty times, depending on the device being fabricated. In one embodiment, the layers are doped to provide free electron or hole concentration in the defect eliminated layer (2') preferably in the $10^{17}$–$10^{19}$ cm$^{-3}$ range.

Steps (940)–(960) are optionally repeated preferably two to forty times to provide optimal elimination of defects.

This method fabricates defect-free semiconductor structures by selective evaporation of defect-rich regions. One of the primary focuses of this method is the elimination of defects in the active regions of semiconductor diode lasers.

In one embodiment of the method, defect-free regions at the surface formed by the above-described treatment are used as templates for further epitaxial growth of semiconductor materials having an arbitrary lattice parameter, and the device is formed on top of the surface.

Figure 1:
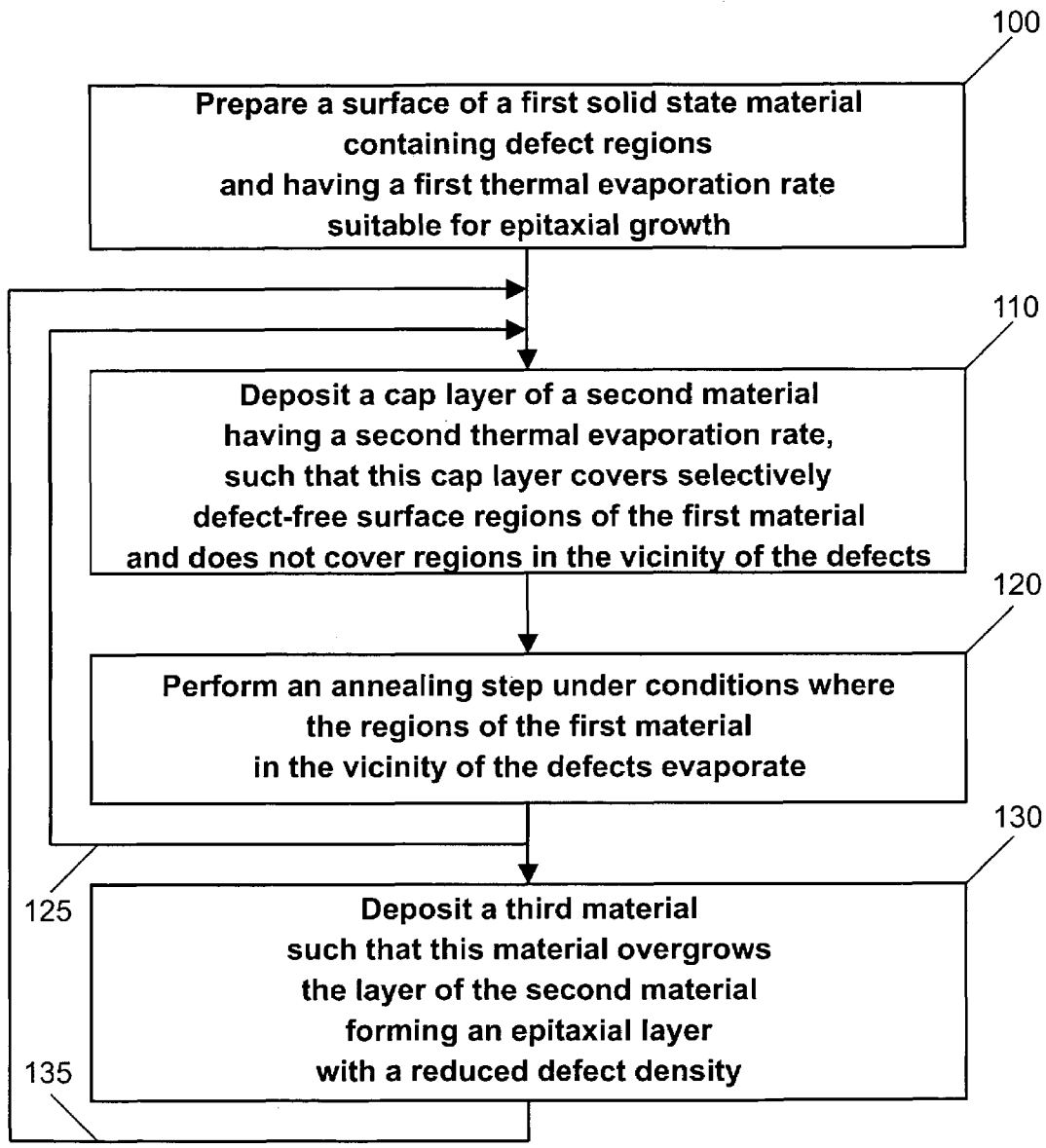
FIG. 1 shows a flowchart of the method in the preferred embodiment of the invention.

FIG. 1 shows a flowchart of a method of the present invention, which grows defect-free epitaxial layers on top of a material containing defects. The method includes multiple steps. In step (100), a surface suitable for further epitaxial growth and containing defect regions, for example a first solid state material, is prepared. In a preferred embodiment, the first solid state material is a substrate or a first epitaxial layer. The first solid state material has a first thermal evaporation rate.

In step (110), a cap layer composed of a second material is deposited on the surface of the first solid state material. The cap layer is preferably thin. For example, in an embodiment of the present invention, where AlAs is used as a cap layer material, the thickness of the AlAs cap layer is adjusted according to the deposition and annealing temperature to have the regions near the defects open prior to the etching procedure. In the example of etching InGaAs at 700° C., the AlAs cap thickness is to be kept preferably between 0.2 and 5 nm.

In another embodiment, the defect region can be covered by the cap layer at the initial stage of the etching and the open regions appear upon the evaporation and redistribution of the cap material during the high-temperature annealing phase. In this embodiment, the cap layer is preferably thinner than 30 nm.

The second material preferably has a second thermal evaporation rate lower than the first evaporation rate. The cap layer preferably covers the defect-free regions of the first solid state material and does not cover regions in the vicinity of at least some defects.

Step (120) is an annealing step performed under conditions where at least some regions of the first solid state material in the vicinity of the defects, which have not been covered by the cap layer, evaporate at least from some near-surface regions of the first solid state material. The defect-free regions covered by the cap layer persist.

Steps (110) and (120) are preferably repeated, if desired, in step (125). Each time these steps are repeated, the method preferably addresses a different type of defects. In a preferred embodiment, the number of repetitions ranges from two to forty.

A third material is deposited in step (130). The third material covers surface regions of the cap layer and forms a defect-free epitaxial layer suitable for further epitaxial growth.

Steps (110) through (130) are preferably repeated in step (135) to increase the effect of the defect reduction. In a preferred embodiment, the number of repetitions ranges from two to fifty.

The method of the present invention, which grows defect-free layers on top of defect-containing layers, is illustrated in detail by particular embodiments in the following descriptions of the Figures.

Figure 2:
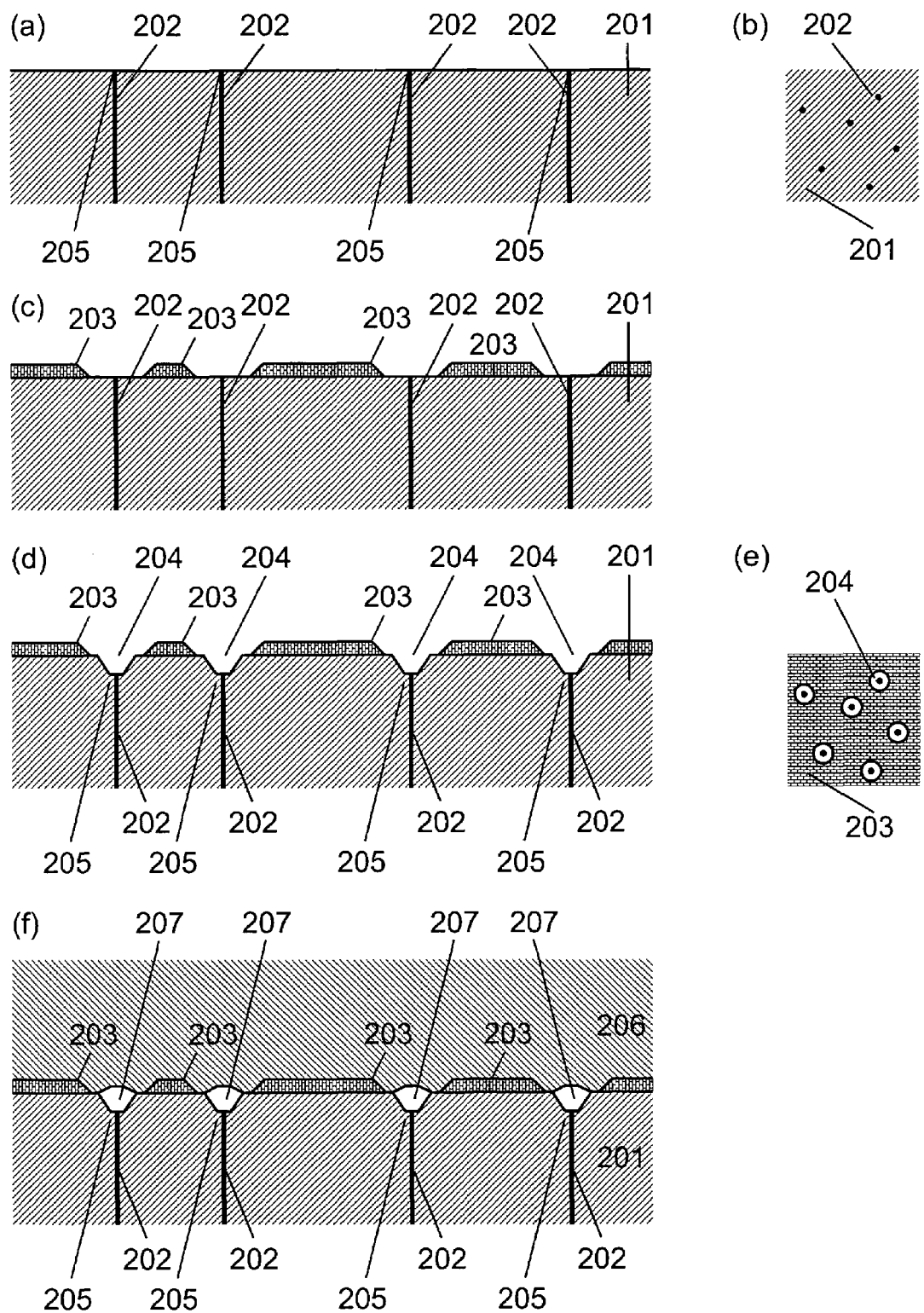
FIG. 2(a) shows a schematic cross-section of a first solid-state material in a preferred embodiment of the invention.
FIG. 2(b) shows a schematic top view of the first material in FIG. 2(a) showing the exits of defects on the surface according to a preferred embodiment of the invention.
FIG. 2(c) shows FIG. 2(a) after the second material has been deposited in a preferred embodiment of the invention.
FIG. 2(d) shows FIG. 2(c) after an annealing step has been performed in a preferred embodiment of the invention.
FIG. 2(e) shows a schematic top view of FIG. 2(d).
FIG. 2(f) shows FIG. 2(d) after the overgrowth by a third material has been performed in a preferred embodiment of the invention.

FIG. 2 shows an example of an embodiment of the present invention. FIG. 2(*a*) corresponds to step (100) and shows schematically a cross-section of the first solid state material (201), shown here as an epitaxial layer. The epitaxial layer (201) has a first thermal evaporation rate and includes extended defects (202). The type of defects (202) in the epitaxial layer (201) include, but are not limited to, threading dislocations, screw dislocations, stacking faults, antiphase domain boundaries, or any combination thereof. FIG. 2(*b*) shows a top view of the epitaxial layer (201) showing exits (205) of extended defects (202) on the surface.

Preferred materials of the epitaxial layer (201) include, but are not limited to, semiconductors such as Si, GaAs, GaSb, InP, or GaN, or semiconductor alloys such as $Si_{1-x}Ge_x$, $Ga_{1-x}In_xAs$, or $Ga_{1-x}In_xN$. Preferred materials of the cap layer (203) include, but are not limited to semiconductors, such as Si, AlAs or AlN.

The most damaging types of defects in device applications are extended defects. These defects include, but are not limited to, threading dislocations, screw dislocations, stacking faults, and antiphase domain boundaries (e.g., in the case of GaAs growth on Si). These defects are especially damaging because they can propagate throughout the further epitaxial layers. Point defects like dislocation loops, defect dipoles, three-dimensional dislocated clusters, and precipitates of impurity atoms on the surface are also potentially damaging, as these defects can give rise to other defects propagating in the epitaxial layers.

The surface regions of the epitaxial layer (201) in the vicinity of the exits of extended defects (202) and the surface regions remote from the exits of the extended defects preferably have different physical characteristics. These two types of surface regions can differ in strain, in surface energies, in the intrinsic surface stress, in surface morphology, in wetting/non-wetting properties regarding the deposition of another material, or in any combination of these characteristics.

When the cap layer (203) is deposited on the surface containing defects in step (110), it grows preferably at the energetically favorable surface regions and does not grow at unfavorable surface regions. The change of the energy of the system per unit surface area may be written as follows:

$$\Delta E = f_{elast} h + \Delta \Gamma, \quad (1)$$

where $f_{elast}$ is the elastic strain energy density, h is the cap layer thickness, and $\Delta\Gamma$ is the combination of surface and interface energies, $$\Delta\Gamma = \gamma_{cap} + \gamma_{interface} - \gamma_1, \quad (2)$$

which determines the wetting ($\Delta\Gamma<0$) or non-wetting ($\Delta\Gamma>0$) conditions at the deposition of the cap material. Here $\gamma_1$ is the surface energy of the substrate or the first epilayer, $\gamma_{cap}$ is the surface energy of the cap layer, and $\gamma_{interface}$ is the interface energy. The elastic strain energy density depends on the local strain. The same is valid for the surface and interface energies, which are renormalized in the strain field. Thus, e.g., the surface energy of the substrate or the first epilayer $\gamma_1$ may be written as a function of the strain tensor $\epsilon_{ij}$ as follows:

$$\gamma_1(\epsilon_{ij}) = \gamma_1^{(0)} + \tau_{ij}\epsilon_{ij}, \quad (3)$$

where $\gamma_1^{(0)}$ is the surface energy of an unstrained surface, and $\tau_{ij}$ is the intrinsic surface stress tensor. The combination of surface and interface energies $\Delta\Gamma$ from Eq. (3) depends on the local strain as well. Depending on material parameters, the energetically preferred positions for the growth of the cap layer are dominated by any of the above mentioned differences between the two surface regions.

It should be noted that, for some combinations of materials, the cap material is attracted to the defect regions and preferably decorates defects. For other material combinations, the cap material is repelled from the defect regions. The latter material combinations are preferably used in the method of the present invention.

FIG. 2(c) shows a cross-section of the epitaxial layer after the cap layer (203), composed of a second material, has been deposited. The cap layer (203) is deposited such that it covers defect-free regions of the surface and does not cover regions in the vicinity of the defects. The material of the cap layer is preferably selected such that it possesses two properties. First, due to the above mentioned difference between defect-free surface regions and surface regions in the vicinity of the defects, the cap layer material covers the surface regions remote from the defect regions and does not cover the defect regions. Second, the cap layer material has a second thermal evaporation rate lower than the first thermal evaporation rate.

Selective deposition can be realized on both planar and wavy surfaces. Additionally, defects themselves affect the surface morphology, resulting in a change of surface reconstruction and/or the onset of steps and/or the onset of tilted facets in the vicinity of the defects. If, due to the change in surface morphology, the regions in the vicinity of the defects are energetically unfavorable for the growth of the cap material, this allows for selective deposition.

FIG. 2(d) shows a cross-section of the epitaxial structure after the thermal annealing step (120). Evaporated regions of the first material in the vicinity of the defects form troughs in the regions of the exits of the defects. Defect-free surface regions covered with the cap layer (203) remain unaffected, whereas uncovered regions of the epitaxial layer (201) in the vicinity of the defects (202) at least partially evaporate, forming troughs (204) in the vicinity of the defect exits (205). FIG. 2(e) shows troughs (204) surrounding exits of the defects (205) in a top view of FIG. 2(d).

FIG. 2(f) shows a cross-section of the structure after the overgrowth of a third material forming an epitaxial layer (206) in step (130). The troughs (204) over the exits (205) of the defects (202) are overgrown from the sides, forming voids (207) in the epitaxial structure. The third material forms a defect-free epitaxial layer (206), suitable as a template for further epitaxial growth. The material of the layer (206) is selected such that the overgrowth starts from the regions covered by the thin layer (203), further proceeds via the lateral epitaxial overgrowth such that regions of the layer (206) start to form on top of the thin layer (203), and then merge, forming a defect-free epitaxial layer (203).

In a semiconductor device based on a defect-free epitaxial layer grown on top of a defect-containing layer, the main region is remote from the interface between the layer (203) and the layer (206). Thus, in electronic devices such as a high electron mobility transistor, the layer in which a high mobility is realized is remote from the voids (207). In optoelectronic devices, such as semiconductor diode lasers, the active region is remote from the voids (207). Thus, the voids (207) do not directly affect the performance of the semiconductor devices. One of the advantages the voids (207) provide is that the voids (207) block further propagation of extended defects (202) into the epitaxial layer (206) and further epitaxial layers.

The voids are formed preferably in cases when the etching of the defect regions is performed to a significant depth, preferably exceeding 10 nm, in such a way that vertically and laterally-extended voids are formed in the defect-containing layer. This approach is preferable when the dislocations impose very significant strain, which may stimulate their propagation into the defect-free epilayer after the voids are filled with defect-free material. In another embodiment the voids are formed intentionally to achieve the desired mechanical, electrical or optical property. For example, a higher resistivity of a layer with voids can be achieved than in a layer without voids. In another example, the layer with voids may provide high optical reflectivity and can be used for fabrication of distributed Bragg reflectors.

Preferred materials of the overgrowth layer (206) include, but are not limited to, semiconductors such as Si, GaAs, GaSb, InP, or GaN, or semiconductor alloys such as $Si_{1-x}G_x$, $Ga_{1-x}In_xAs$, or $Ga_{1-x}In_xN$. In some embodiments, the material of the overgrowth layer (206) is the same material as the epitaxial layer (201).

Some preferred material combinations include, but are not limited to, the following:

If the layer (201) is composed of the semiconductor alloy $Si_{1-x}Ge_x$, the preferred embodiment for the cap layer (203) is Si. In this embodiment, the defect-free layer (206) is preferably composed of $Si_{1-x}Ge_x$, with the same composition "x" as the layer (201).

If the layer (201) is composed of the semiconductor alloy $Ga_{1-x}In_xAs$, the preferred composition for the cap layer (203) is AlAs. In this embodiment, the defect-free layer (206) preferably is composed of $Ga_{1-x}In_xAs$, with the same composition "x" as the layer (201).

When the layer (201) is composed of the semiconductor alloy $Ga_{1-x}In_xN$, the cap layer (203) is preferably AlN. In this embodiment, the defect-free layer (206) is preferably formed of $Ga_{1-x}In_xN$, with the same composition "x" as the layer (201).

If the layer (201) is GaN, the preferred embodiment for the cap layer (203) is AlN and the defect-free layer is preferably GaN.

In another embodiment of the present invention, a thin pseudomorphic layer is deposited on the substrate or a first epilayer containing defects prior to the cap layer (203) being deposited. This pseudomorphic layer possesses two properties. First, the thickness of the pseudomorphic layer is below the critical thickness at which the formation of new defects occurs. In addition, the pseudomorphic layer provides necessary selectivity for the further deposition of the cap layer (203) such that the cap layer material grows on the defect-free regions and does not grow in the vicinity of the defects that have propagated from the substrate or the first epilayer to the surface of the pseudomorphic layer.

In a preferred application of this embodiment, the materials are a defected GaAs substrate, onto which a thin pseudomorphic $Ga_{1-x}In_xAs$ layer is deposited, onto which a thin AlAs cap layer is deposited. Then, the structure is overgrown by GaAs, which forms a defect-free epitaxial layer.

In another embodiment of the present invention, a thin pseudomorphic layer is deposited on the defect-free epitaxial layer. Preferred materials for this embodiment include a $Si_{1-x}Ge_x$ epitaxial layer containing propagating defects, capped by a thin Si cap layer, onto which a defect-free $Si_{1-x}Ge_x$ layer is deposited, onto which a thin pseudomorphic strained Si layer is deposited.

In another embodiment of the present invention, the evaporation rate of the defect-regions is increased by enhancement of the evaporation process. This process is preferably enhanced by chemical etching using a flux of chemically-active atoms or molecules or by plasma etching when the uncovered material in the vicinity of defects has a higher etching rate due to plasma-assisted or chemical etching than the cap material. In this case, the temperature should be sufficient to provide enough energy for the chemical or plasma reaction to occur.

In another embodiment, wet etching eliminates the defected regions such that the uncovered material in the vicinity of the defects has a higher etching rate than the cap material.

The long-range order of the crystal lattice is not necessary to the method of the present invention. The same approach can be used for selective defect elimination in any solid-state materials, including but not limited to organic materials, glasses, or photoresists.

Figure 3:
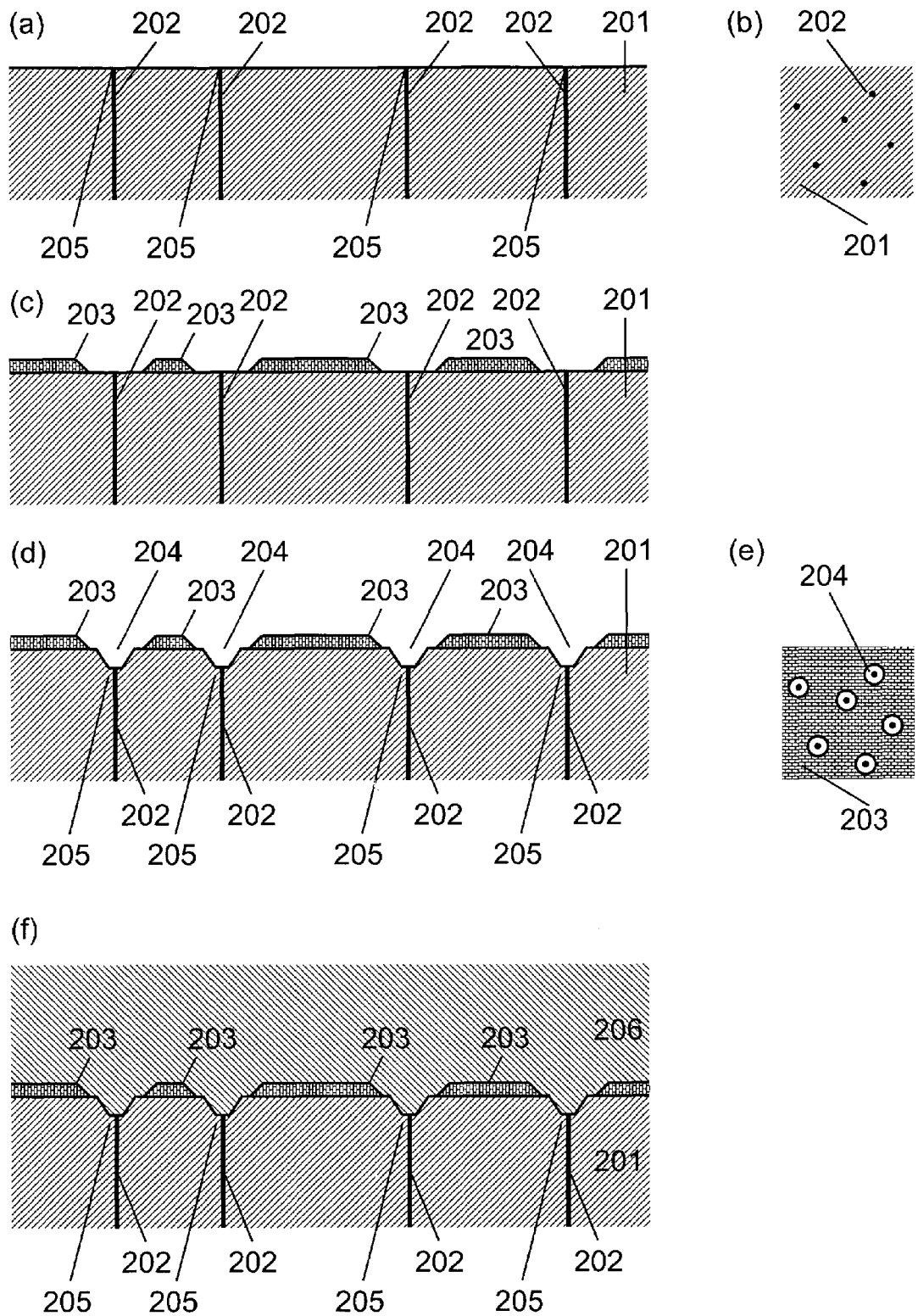
FIG. 3(a) shows a schematic cross-section of an epitaxial layer, or a substrate, comprising defects according to another embodiment of the invention.
FIG. 3(b) shows a schematic top view of the epitaxial layer in FIG. 3(a), showing the exits of defects on the surface according to another embodiment of the invention.
FIG. 3(c) shows FIG. 3(a) after the second material has been deposited.
FIG. 3(d) shows FIG. 3(c) after an annealing step has been performed.
FIG. 3(e) shows a schematic top view of FIG. 3(d).
FIG. 3(f) shows FIG. 3(d) after the overgrowth by a third material has been performed.

FIG. 3 shows the method according to another embodiment of the present invention. FIGS. 3(a) through 3(e) are the same as FIGS. 2(a) through 2(e), respectively. FIG. 3(f) shows a cross section of the structure after the overgrowth process. The third material forms a defect-free epitaxial layer, suitable as a template for further epitaxial growth. In this embodiment, the material of the overgrowth layer (206) covers troughs (204) completely, and no voids remain after the overgrowth.

Figure 4:
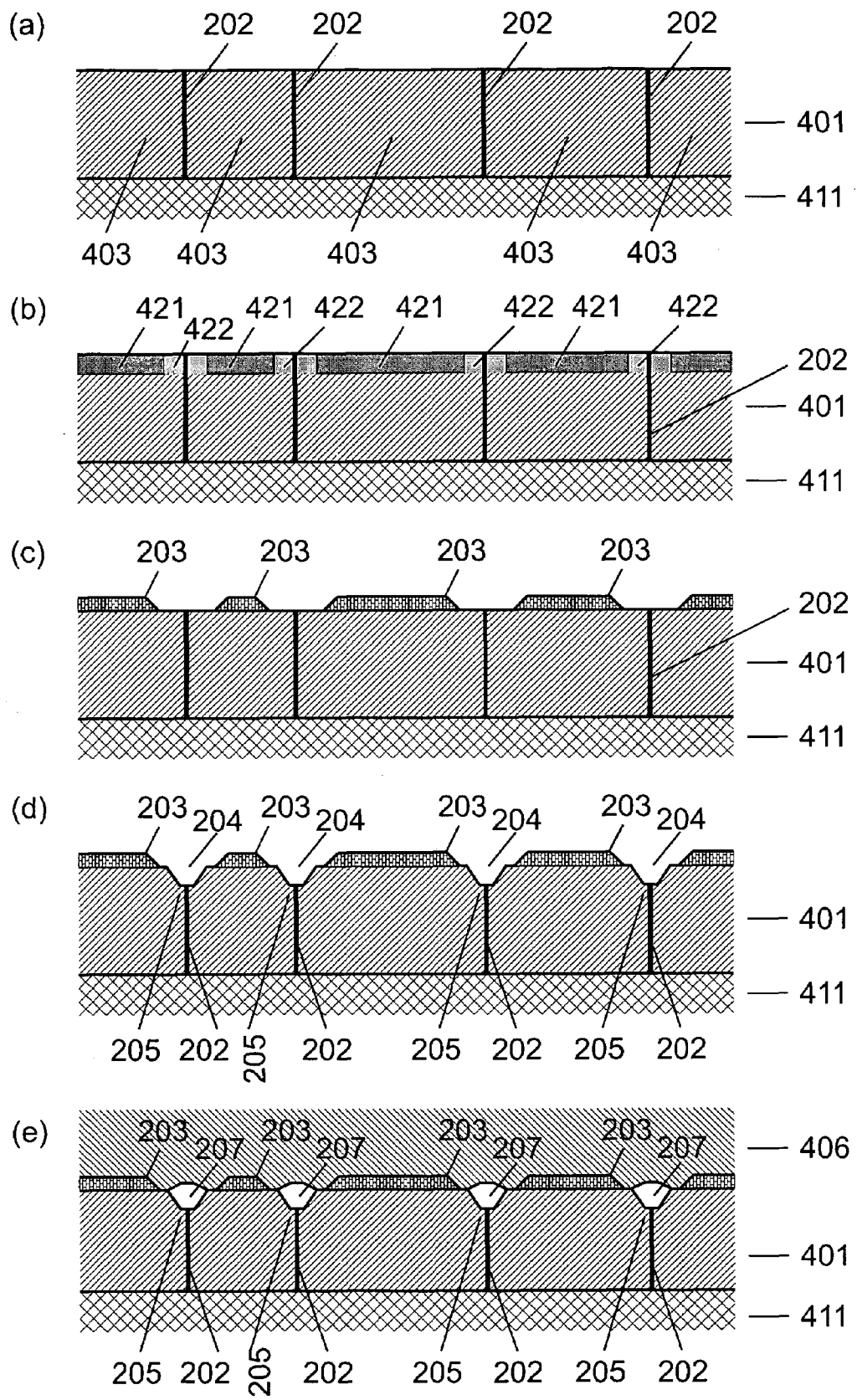
FIG. 4(a) shows a layer grown epitaxially on a substrate in an alternative embodiment of the invention.
FIG. 4(b) shows FIG. 4(a), where subsurface defect-free regions of the epitaxial layer, on the one hand, and subsurface regions of the epitaxial layer in the vicinity of the defects, on the other hand, having different strain states, are marked differently.
FIG. 4(c) shows FIG. 4(a) after a second material has been deposited.
FIG. 4(d) shows FIG. 4(c) after an annealing step is performed.
FIG. 4(e) shows FIG. 4(d) after an overgrowth by a third material has been performed.

FIG. 4 shows the method according to an alternative embodiment of the present invention. FIG. 4(a) shows an epitaxial layer (401) grown on a substrate (411). The thickness of the epitaxial layer exceeds the critical thickness for the formation of defects. Thus propagating defects are formed in the epitaxial layer. The epitaxial layer (401) has a first thermal evaporation rate and is preferably lattice-mismatched with respect to the substrate (411). When the thickness of the layer (401) exceeds the critical thickness required for the creation of defects, defects (202) form, and the layer (401) continues to grow metamorphically. The layer (401) comprises large domains (403) that are defect-free and have a lattice parameter close to or nearly equal to the lattice parameter of unstrained material forming the layer (401). These domains are separated by relatively narrow regions in the vicinity of the extended defects (202).

Preferred materials for the substrate (411) include, but are not limited to semiconductors such as Si, GaAs, GaSb, InP, SiC, or sapphire. A preferred material for the epitaxial layer (401) is a material lattice-mismatched to the substrate (411).

FIG. 4(b) illustrates a difference between the strain state of the surface regions (421) far from the extended defects (202) and the surface regions (422) in the vicinity of the extended defects (202).

FIG. 4(c) shows schematically the epitaxial structure after the deposition of the cap layer (203). The cap layer (203) has a second thermal evaporation rate lower than the first thermal evaporation rate. The cap layer (203) covers the surface regions (421) of the epitaxial layer (401) far from the extended defects, whereas the surface regions (422) in the vicinity of the extended defects remain uncovered. The defect-free regions of the first layer are now covered, and regions of the first layer in the vicinity of the defects remain uncovered.

FIG. 4(d) shows the epitaxial structure after the thermal annealing step. The uncovered parts of the surface of the first layer at the exits of the defects are annealed and troughs form. Since the cap layer (203) has a lower thermal evaporation rate than the layer (401), a thermal annealing regime (temperature and duration) is selected such that the layer (203) remains unaffected whereas the uncovered regions of the layer (401) in the vicinity of the defects (202) at least partially evaporate. Troughs (204) are formed in the vicinity of the exits (205) of the defects.

FIG. 4(e) shows the epitaxial structure after the overgrowth step. The troughs are now overgrown from the sides, and a defect-free epitaxial layer of the third material has been formed. Voids are formed at the exits of the defects of the first layer. The material and the thermal annealing regime of the overgrowth step are preferably selected so that the lateral epitaxial overgrowth mode occurs. Regions of the overgrowth layer (406) start to form on top of the cap layer (203) and then merge, forming a defect-free epitaxial layer (406). Troughs (204) over the exits of the defects (205) create, after the overgrowth, voids (207) in the epitaxial structure. The defect-free epitaxial layer (406) is preferably selected such that it has a lattice parameter close to or equal to the lattice parameter of the unstrained material forming the layer (401), and therefore is lattice-mismatched to the substrate (411). Thus, a defect-free layer (406), lattice-mismatched to the substrate (411) and suitable for a further epitaxial growth, is formed.

Table 1 shows different preferable combinations of materials to be used in the layers of the device. For example, in one embodiment, if the substrate (411) is formed of Si, the epitaxial layer (401) is preferably formed of $Ga_{1-x}In_xAs$, the cap layer (203) is preferably formed of AlAs, and the defect-free epitaxial layer (406) is preferably formed of $Ga_{1-x}In_xAl_yAs$ having the same composition "x" as the epitaxial layer (401). Note that the aluminum composition "y" hardly affects the lattice parameter, and the two layers remain nearly lattice-matched irrespective of "y".

In another embodiment shown in Table 1, the substrate (411) is Si with the surface orientation (111), the epitaxial layer (401) is GaN, the cap layer (203) is AlN, and the defect-free layer (406) is preferably formed of GaN.

TABLE 1

| Substrate (411) | Epitaxial Layer (401) | Cap Layer (203) | Epitaxial Layer (406) | Comments |
|---|---|---|---|---|
| Si | $Si_{1-x}Ge_x$ | Si | $Si_{1-x}Ge_x$ | Composition "x" same in layers (401) and (406) |
| Si | $Ga_{1-x}In_xAs$ | AlAs | $Ga_{1-x}In_xAs$ | Composition "x" same in layers (401) and (406) |
| Si | $Ga_{1-x}In_xAs$ | AlAs | $Ga_{1-x-y}In_xAl_yAs$ | Composition "x" same in layers (401) and (406) |
| GaAs | $Ga_{1-x}In_xAs$ | AlAs | $Ga_{1-x}In_xAs$ | Composition "x" same in layers (401) and (406) |
| GaAs | $Ga_{1-x}In_xAs$ | AlAs | $Ga_{1-x-y}In_xAl_yAs$ | Composition "x" same in layers (401) and (406) |
| Si(111) | GaN | AlN | GaN | |
| Si(111) | $Ga_{1-x}In_xN$ | AlN | $Ga_{1-x}In_xN$ | Composition "x" same in layers (401) and (406) |
| Si(111) | $Ga_{1-x-y}In_xAl_yN$ | AlN | $Ga_{1-x-y}In_xAl_yN$ | Composition "x" and "y" same in layers (401) and 406 |
| SiC | GaN | AlN | GaN | |
| SiC | $Ga_{1-x}In_xN$ | AlN | $Ga_{1-x}In_xN$ | Composition "x" same in layers (401) and (406) |
| SiC | $Ga_{1-x-y}In_xAl_yN$ | AlN | $Ga_{1-x-y}In_xAl_yN$ | Composition "x" and "y" same in layers (401) and (406) |
| Sapphire | GaN | AlN | GaN | |
| Sapphire | $Ga_{1-x}In_xN$ | AlN | $Ga_{1-x}In_xN$ | Composition "x" same in layers (401) and (406) |
| Sapphire | $Ga_{1-x-y}In_xAl_yN$ | AlN | $Ga_{1-x-y}In_xAl_yN$ | Composition "x" and "y" same in layers (401) and (406) |

In another embodiment, a thin pseudomorphic layer of strained Si is grown on a defect-free metamorphic $Si_{1-x}Ge_x$ layer. As another example, if the substrate (411) is Si, the epitaxial layer (401) is preferably GaAs, onto which a thin pseudomorphic layer of $Ga_{1-x}In_xAs$ is deposited, which is followed by a thin cap layer preferably formed of AlAs, followed by the defect-free GaAs layer.

Figure 5:
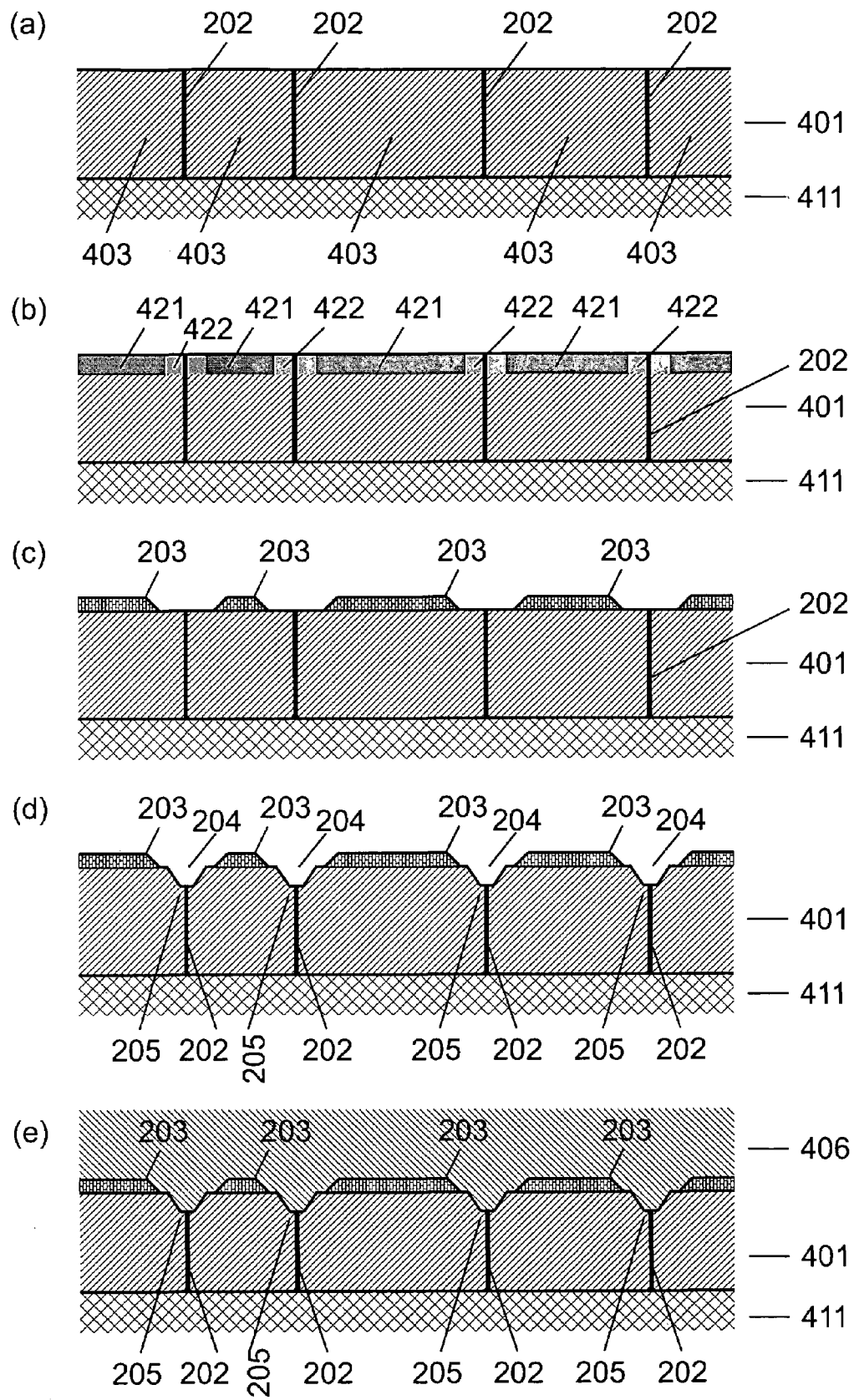
FIG. 5(a) shows a layer grown epitaxially on a substrate, whereas the thickness of the epitaxial layer exceeds the critical thickness and defects have been formed in the epitaxial layer, in an alternative embodiment of the invention.
FIG. 5(b) shows FIG. 5(a), where subsurface defect-free regions of the epitaxial layer, on the one hand, and subsurface regions of the epitaxial layer in the vicinity of the defects, on the other hand, having different strain states, are marked differently.
FIG. 5(c) shows FIG. 5(a) after a second material has been deposited.
FIG. 5(d) shows FIG. 5(c) after an annealing step has been performed.
FIG. 5(e) shows FIG. 5(d) after an overgrowth by a third material has been performed.

FIG. 5 shows schematically the method according to another embodiment of the present invention. FIGS. 5(a) through 5(d) correspond to FIGS. 4(a) through 4(d), respectively.

FIG. 5(e) shows a cross section of the structure after the overgrowth step. In this embodiment, the troughs are overgrown from the sides, and a defect-free epitaxial layer of the third material is formed. The troughs are now filled with the third material, and there are no voids. In this embodiment, the material of the overgrowth layer (406) covers troughs (204) completely, and no voids remain after the overgrowth. Thus, a defect-free layer (406), lattice-mismatched to the substrate (411) and suitable for a further epitaxial growth, is formed.

The present method of fabrication of defect-free epitaxial layers grown on top of plastically relaxed layers can be employed widely in practically all types of semiconductor devices. Some of these devices include, but are not limited to, high electron mobility transistors, field effect transistors, heterojunction bipolar transistors, integrated circuits, diode lasers, light-emitting diodes, photodetectors, optical amplifiers, far infrared intraband detectors, intraband far infrared emitters, resonant tunneling diodes, solar cells, optically bistable devices, current-injection edge-emitting lasers, vertical cavity surface emitting lasers, and tilted cavity lasers.

In particular, the fabrication of high electron mobility transistors (HEMT) requires materials with a high mobility. These materials are frequently lattice-mismatched to commercially available substrates, like Si, GaAs, SiC or sapphire. Application of the method of the present invention allows for fabrication of defect-free layers on top of plastically relaxed layers, thus allowing for the fabrication of any desired material, defect-free.

In an embodiment of the present invention, a high electron mobility transistor (HEMT) is fabricated on a defect-free $Ga_{1-x}In_xAs$ layer, grown on top of a plastically relaxed $Ga_{1-x}In_xAs$ layer, which is grown on top of a Si or GaAs substrate.

In another embodiment of the present invention, a high electron mobility transistor (HEMT) is fabricated on a defect-free GaN layer grown on top of a plastically relaxed GaN layer, which is grown on top of a substrate including, but not limited to, Si (111), SiC, or sapphire.

In yet another embodiment of the present invention, a high electron mobility transistor (HEMT) is fabricated on a defect-free $Ga_{1-y}In_yN$ layer, grown on top of a plastically relaxed $Ga_{1-x}In_xN$ layer, which is grown on top of a substrate composed of a material including, but not limited to, Si (111), SiC, or sapphire, where the composition "y" is preferably close to the composition "x".

In an alternative embodiment of the present invention, a high electron mobility transistor (HEMT) is fabricated on a defect-free $Ga_{1-z-t}In_zAl_tN$ layer, grown on top of a plastically relaxed $Ga_{1-x-y}In_xAl_yN$ layer, which is grown on top of a substrate including, but not limited to, a Si (111) substrate, a SiC substrate, or a sapphire substrate, where the composition "z" is preferably close to the composition "x", and the composition "t" is preferably close to the composition "x".

Another embodiment for a high mobility material is biaxially strained Si such that four valleys of the conduction band are shifted to higher energy and become depopulated, whereas the remaining two valleys of the conduction band shift to a lower energy and remain populated. Then, the longitudinal effective mass which governs the in-plane mobility of electrons significantly decreases, resulting in a substantial increase of mobility. Thus, a thin pseudomorphically strained Si layer is grown on top of a defect-free $Si_{1-y}Ge_y$ layer, which is grown on top of a plastically relaxed $Si_{1-x}Ge_x$ layer, which is grown on top of a Si substrate. This structure can be used in integrated circuits.

Another group of embodiments of the present invention refers to semiconductor diode lasers on a GaAs substrate. A need to shift the wavelength of emitted laser light to the wavelength region from 1.4 to 1.8 μm requires using active regions formed of an alloy $Ga_{1-y}In_yAs$. To form these active regions without defects, a defect-free layer of $Ga_{1-y}In_yAs$ is grown on a plastically relaxed $Ga_{1-x}In_xAs$ layer, which is grown on a GaAs substrate.

Figure 6:
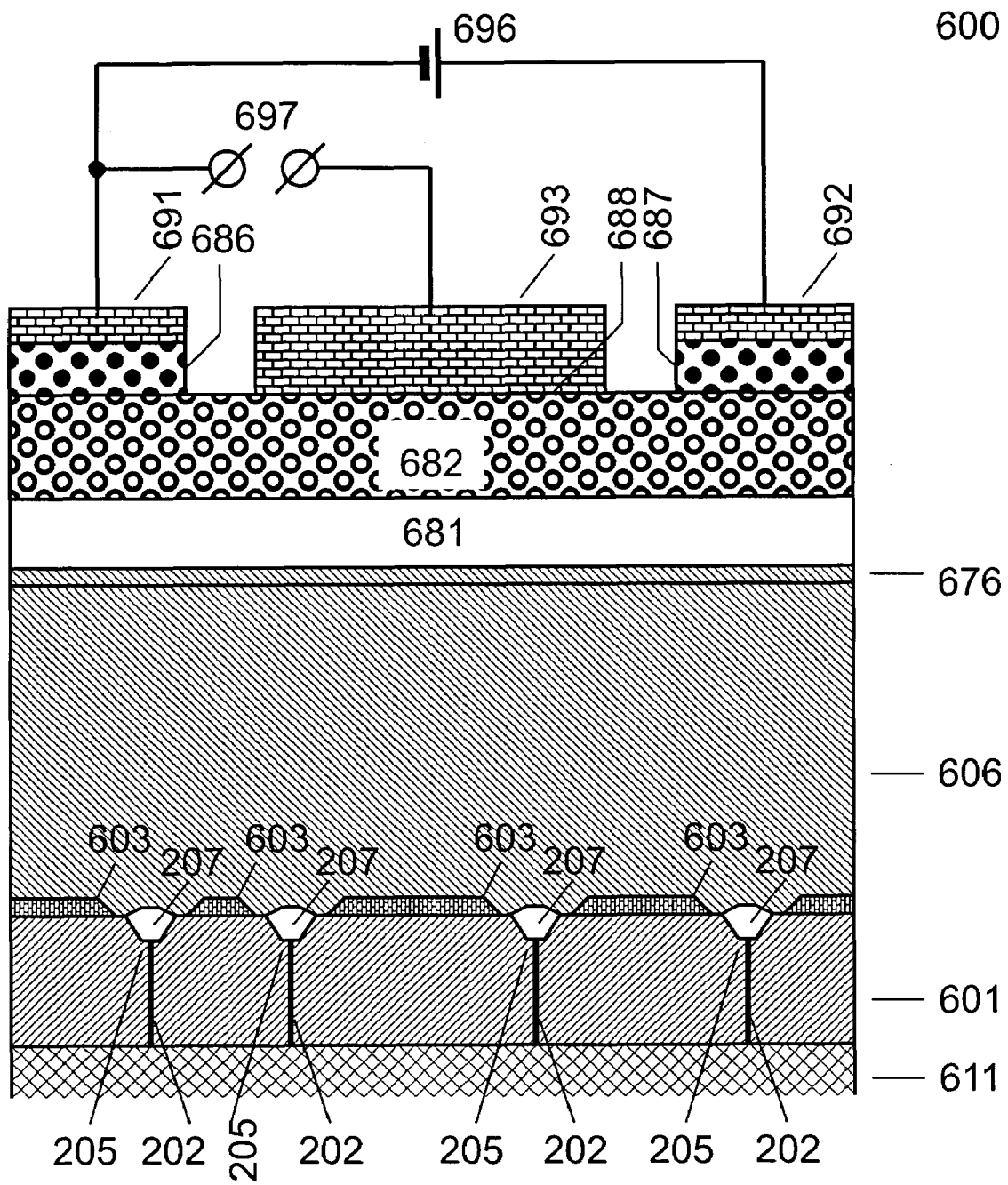
FIG. 6 shows a schematic view of a high electron mobility transistor (HEMT) in a preferred embodiment of the present invention.

FIG. 6 shows a high electron mobility transistor (HEMT) (600) grown according to another embodiment of the present invention. In this embodiment, the undoped regions are formed using the method of FIG. 1, and an n-channel is self-formed in a part of the undoped region. The structure is grown epitaxially on a substrate (611). In a preferred embodiment, the substrate (611) is composed of undoped GaAs. The epitaxial layer (601) is preferably composed of undoped $Ga_{1-x}In_xAs$, and the thickness of the layer (601) exceeds the critical thickness required for plastic relaxation such that the layer (601) is plastically relaxed and contains propagating defects (202). The cap layer (603) is preferably a thin layer of AlAs. The layer (606) is preferably formed of undoped $Ga_{1-y}In_yAs$, having the composition "y" preferably close or equal to the composition "x" of the layer (601). According to another embodiment of the present invention described in detail in FIG. 4, the layer (606) has a substantially reduced density of defects compared to the layer (601) and may be considered defect-free.

The layer (681) is grown epitaxially on the layer (606) and is preferably formed of undoped $Ga_{1-z-t}In_zAl_tAs$, where the indium composition "z" is preferably close or equal to the composition "y" of the layer (606) such that the layer (681) is lattice-matched or nearly lattice-matched to the layer (606).

The layer (682) is grown epitaxially on the layer (681) and is preferably composed of n-doped $Ga_{1-r-s}In_rAl_sAs$, where the indium composition "r" is preferably close or equal to the composition "y" of the layer (606) such that the layer (682) is lattice-matched or nearly lattice-matched to the layers (606) and (681). The layer (682) is n-doped, preferably to the donor density $10^{18}$ cm$^{-3}$ or above. Possible donor impurities include, but are not limited to, S, Se, or Te, and amphoteric impurities including Si, Ge, or Sn. The latter are introduced under such technological conditions that they are incorporated predominantly into the cation sublattice and serve as donor impurities. The preferred embodiment is n-doping by Si impurities.

Regions (686) and (687) are regions, which have persisted from the n$^+$—doped layer after a part of it has been etched off. They are formed preferably from $Ga_{1-r}In_rAs$, having the same indium composition "r" as the layer (682), and are n-doped preferably to a higher doping level than the layer (682).

N-contacts (691) and (692) are preferably formed from multi-layered metal structures. They can be formed from, but are not limited to, the structure Ni—Au—Ge. The contact (693) is a gate forming Schottky barrier (688) on the metal-semiconductor interface.

The HEMT (600) operates as follows. Energy positions of the donor levels in the layer (682) are at higher energies than the bottom on the conduction band in the layer (606). Therefore electrons from the donor levels move due to thermal activation and/or tunneling through the barrier (681) from the layer (682) to the layer (606). Then the ionized donors in the layer (682) positively charge the layer (682), while excess electrons in the layer (606) negatively charge the layer (606). This generates an electric field, which hinders further charging of the structure and attracts electrons in the layer (606) to the heterojunction with the barrier (681). The electrons in the layer (606) thus form a two-dimensional electron gas in a narrow layer (676). The electrons in this two-dimensional electron gas have a high mobility because scattering by ionized donor impurities is reduced as donors are spatially separated from the electron gas (as usual in HEMTs). In addition, the electron gas is formed in a $Ga_{1-y}In_yAs$ material, where electrons have a higher mobility than in GaAs.

A bias (696) is applied between the source (691) and the drain (692), allowing a current of electrons from the source (691) to the drain (692) through the highly conductive n-channel (676). The voltage (697) applied to the gate (693) controls the electron density in the channel (676) and thus controls the current through the channel. The HEMT (600) is preferably used, for example, as a high-frequency amplifier, or as a logic element in integrated circuits.

In another embodiment of the present invention, a high electron mobility transistor is formed under such technological conditions that the defect-free epitaxial contains no voids.

Figure 7:
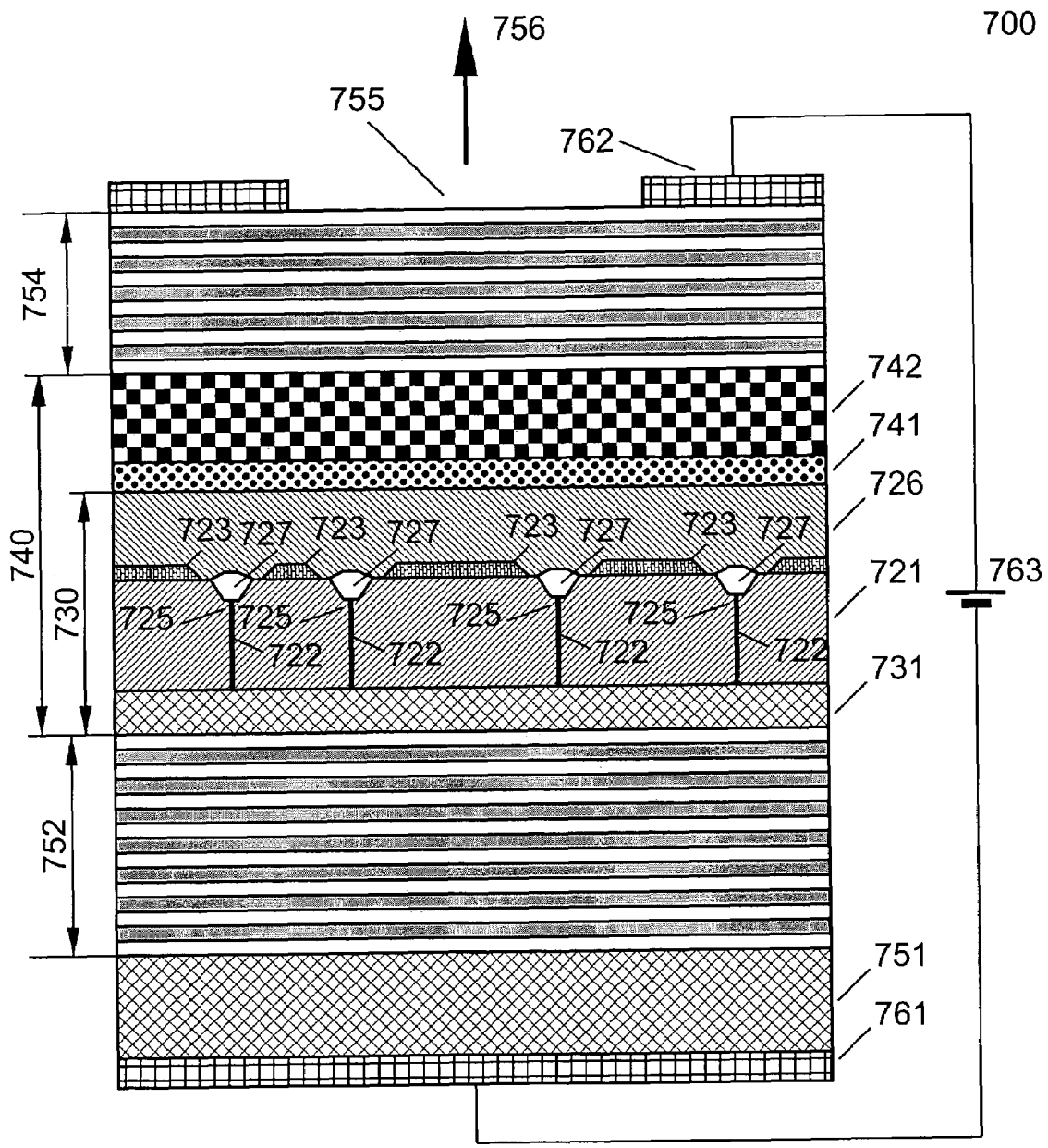
FIG. 7 shows a schematic view of a semiconductor vertical cavity surface emitting laser (VCSEL), in which the n-doped part of the cavity is formed using the method of the present invention.

FIG. 7 shows a vertical cavity surface emitting laser (VCSEL) (700) fabricated using the method of the present invention. One embodiment of a VCSEL shown schematically in FIG. 7 is a GaAs-based VCSEL emitting a laser light at the wavelength in the wavelength region from 1.4 to 1.8 μm. VCSEL (700) comprises a cavity (740) sandwiched between a bottom distributed Bragg reflector (bottom DBR) (752) and a top distributed Bragg reflector (top DBR) (754). The bottom DBR (752) is grown epitaxially on a substrate (751).

Different designs for the bottom mirror (752) and for the top mirror (754) can be used, as described, e.g. in *Vertical-Cavity Surface-Emitting Lasers: Design, Fabrication, Characterization, and Applications* by C. W. Wilmsen, H. Temkin, L. A. Coldren (editors), Cambridge University Press, 1999. The preferred embodiment for the bottom mirror (752) is an n-doped multi-layered semiconductor mirror GaAs/GaAlAs. The preferred embodiment for the top mirror (754) is a p-doped multi-layered semiconductor mirror GaAs/GaAlAs.

The structure is grown epitaxially on the substrate (751). The substrate (751) is preferably formed from any III-V semiconductor material or III-V semiconductor alloy, for example, GaAs, InP, or GaSb, and is n-doped. The preferred embodiment for the substrate (751) is n-doped GaAs.

A distributed Bragg reflector (DBR) is used for the bottom mirror (752). The cavity (740) comprises an n-doped region (730), an active region (741), and a p-doped region (742).

The n-doped region (730) of the cavity is made by using the defect reduction method shown in FIG. 1 and FIG. 4. The layer (731) is lattice-matched to the substrate (751). The layer (721) has a predefined lattice parameter value and is preferably lattice-mismatched to the layer (731) (and to the substrate (751)). The thickness of the layer (721) exceeds the critical thickness required to create extended defects, thus extended defects (722) form. The layer (722) is covered by a thin cap layer (723). The cap layer (723) covers defect-free regions of the layer (721) and does not cover the regions in the vicinity of the defects. After the thermal annealing step, troughs are formed over the exits (725) of the defects (722). Overgrowth of the layer (726) proceeds in the lateral epitaxial overgrowth mode, and forms a defect-free layer (726). Voids (727) are formed over the exits of the defects. The defect-free layer (726) is preferably lattice-matched to the layer (721). Thus, the defect-free layer (726) has a predefined lattice parameter value and is preferably lattice-mismatched to the layer (731) and to the substrate (751).

The layer (731) is preferably formed of a semiconductor, lattice-matched, or nearly lattice-matched to the substrate (751), transparent to the generated laser light and n-doped. The preferred embodiment is an n-doped GaAs layer (731).

The layer (721) is formed of a semiconductor, transparent to the generated laser light, n-doped, and, preferably lattice-mismatched to the substrate (751). The preferred embodiment is an n-doped $Ga_{1-x}In_xAs$ layer (721).

The layer (723) is preferably composed of a material with the following characteristics: transparency to the generated laser light, n-doped, a lower thermal evaporation rate than the material of the layer (721), and selective coverage of the defect-free surface regions. The preferred material for the layer (723) for GaAs-based systems is AlAs.

The layer (726) is formed of a semiconductor, transparent to the generated laser light, n-doped, and, preferably, lattice-matched or nearly lattice matched to the layer (721). The preferred embodiment is an n-doped $In_{1-x}Ga_xAs$ layer (726) with the same indium content as in the layer (721).

The defect-free layer (726) is suitable for further epitaxial growth. An active region (741) is grown epitaxially on top of the layer (726). The p-doped region (742) of the cavity is grown epitaxially on top of the active region (741). The top DBR (754) is used for the top mirror and is grown epitaxially on top of the p-doped part of the cavity (742).

The active element (741) is preferably formed by any insertion, the energy band gap of which is narrower than that of the layers (726) and (721). Possible active elements include, but are not limited to, a single-layer or a multi-layer system of quantum wells, quantum wires, quantum dots, or any combination thereof. In one example of the device on a GaAs-substrate, preferred embodiments for the active element include, but are not limited to, a system of insertions of InAs, $Ga_{1-x}In_xAs$, $In_xGa_{1-x-y}Al_yAs$, $In_xGa_{1-x}As_{1-y}N_y$, or similar insertions. A preferred embodiment uses a single-layer or a multi-layer of $In_{1-x}Ga_xAs$ quantum wells or quantum dots having a larger indium content than the one in the layers (721) and (726).

In another embodiment of the present invention, the active element (741) is a strained-compensated multi-layered structure. In this embodiment, the layer (726) is $Ga_{1-x}In_xAs$ with an indium content $x_0$. The active layer is formed by a sequence of alternating layers of quantum wells, quantum wires or quantum dots formed by the deposition of $Ga_{1-x}In_xAs$ with the indium content $x_1 > x_0$ separated by spacer layers formed by the deposition of $Ga_{1-x}In_xAs$ with the indium content $x_2 < x_0$, such that the active layer (741) is on average lattice-matched or nearly lattice-matched to the layer (721).

The p-region (742) of the cavity is formed from a material, transparent to the generated laser light and preferably lattice-matched to the layer (726), and doped by an acceptor impurity. For an embodiment based on a GaAs substrate, the layer (742) is preferably a layer of p-doped $Ga_{1-x}In_xAs$ having the same indium content as the layer (726). Possible acceptor impurities include, but are not limited to Be, Mg, Zn, Cd, Pb, or Mn and amphoteric impurities like Si, Ge, or Sn. The latter are introduced under such technological conditions that they are incorporated predominantly into the anion sublattice and serve as acceptor impurities.

The n-contact (761) is mounted on the bottom side of the substrate (751). The p-contact (762) is mounted on top of the top DBR (754). The VCSEL (700) operates under a forward bias (763) applied through the structure to the active region (741). Generated laser light (756) comes out through the optical aperture (755).

The metal contacts (761) and (762) are preferably multi-layered metal structures. The contact to the n-doped layer, i.e. contact (761), is preferably formed from the structure including, but not limited to, Ni—Au—Ge. The contact to the p-doped layer, i.e. contact (762), is preferably formed by the structure including, but not limited to, Ti—Pt—Au.

In another embodiment of the present invention, a vertical cavity surface emitting laser is formed under such technological conditions that the defect-free epitaxial layer grown on top of the defect containing epitaxial layer is formed such that no voids occur.

Figure 8:
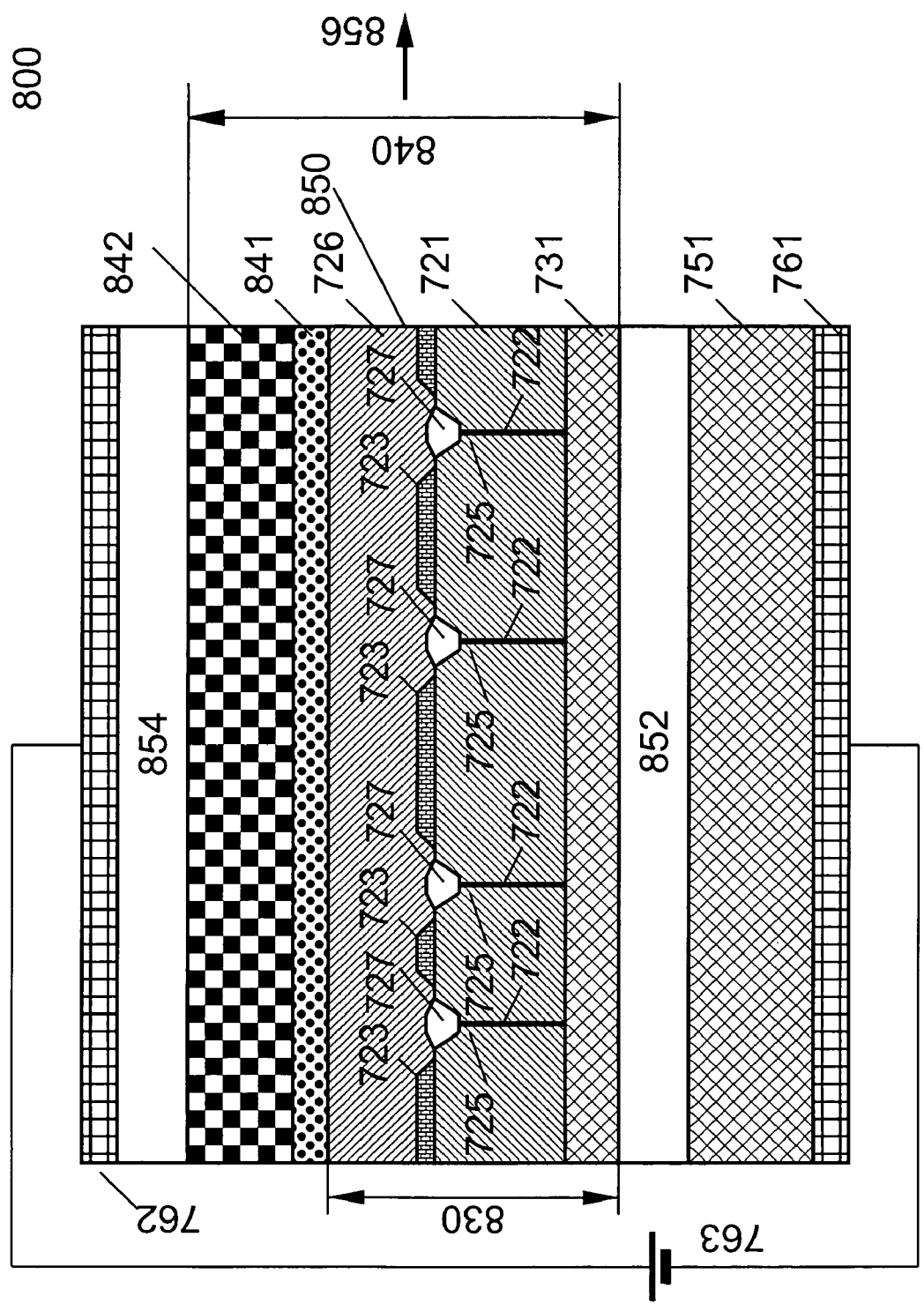
FIG. 8 shows a schematic view of a semiconductor edge-emitting laser, in which the n-doped part of the waveguide is formed using a method of the present invention.

FIG. 8 shows an edge-emitting semiconductor diode laser (800) in another embodiment of the present invention. One embodiment of the edge-emitting laser is a GaAs-based edge-emitting laser emitting a laser light at a wavelength in the wavelength region from 1.4 to 1.8 μm. The waveguide (840) is sandwiched between an n-cladding layer (852) and a p-cladding layer (854).

N-cladding layer (852) is grown epitaxially on a substrate (751). The layer (852), formed of a material preferably lattice-matched or nearly lattice-matched to the substrate (751), is transparent to the generated laser light, and has a refractive index lower than the average refractive index of the waveguide (840). Layer (852) is also doped by a donor impurity. For a GaAs-based device, the preferred material for layer (852) is n-doped $Ga_{1-x}Al_xAs$.

The waveguide (840) comprises an n-doped region (830), an active region (841), and a p-doped region (842). The n-doped region (830) is fabricated using the defect reduction method of the present invention, preferably similarly to the n-doped region of the cavity in the VCSEL shown in FIG. 7.

The active element (841) is preferably formed by any insertion, the energy band gap of which is narrower than that of the layers (726) and (721). Possible active elements include, but are not limited to, a single-layer or a multi-layer system of quantum wells, quantum wires, quantum dots, or any combination thereof. In a device on a GaAs-substrate, preferred embodiments for the active element include, but are not limited to, a system of insertions of InAs, $In_{1-x}Ga_xAs$, $In_xGa_{1-x-y}Al_yAs$, $In_xGa_{1-x}As_{1-y}N_y$, or similar materials. A preferred embodiment is a single-layer or a multi-layer of $In_{1-x}Ga_xAs$ quantum wells or quantum dots having a larger indium content than the indium content in the layers (721) and (726).

In another embodiment of the present invention, the active element (841) is preferably a strained-compensated multi-layered structure. In this embodiment, the layer (726) is $Ga_{1-x}In_xAs$ with an indium content $x_0$. The active region includes a sequence of alternating layers of quantum wells, quantum wires or quantum dots formed by the deposition of $Ga_{1-x}In_xAs$ with the indium content $x_1 > x_0$, separated by spacer layers formed by the deposition of $Ga_{1-x}In_xAs$ with the indium content $x_2 < x_0$, such that the active layer (841) is on average lattice-matched or nearly lattice-matched to the layer (721).

The p-region (842) of the waveguide (840) is composed of a material transparent to the generated laser light, preferably lattice-matched or nearly lattice-matched to the layer (726), and doped by an acceptor impurity. A preferred embodiment is p-doped $In_{1-x}Ga_xAs$ with the same indium content as in the layer (726).

The p-cladding layer (854) is preferably composed of any material, transparent to the generated laser light, having a lower-refractive index than the average refractive index of the waveguide (840), and doped by an acceptor impurity. For a GaAs-based device, the preferred material is p-doped $Ga_{1-x}Al_xAs$.

The edge-emitting laser (800) operates under a forward bias (763) applied through the structure to the active region (841). The waveguide (840) and the cladding layers (852) and (854) form an optical mode of laser radiation, and the laser light comes out 856 through the front facet 850.

Another embodiment of the present invention is a tilted cavity laser (TCL) made according to a design described in the paper by N. N. Ledentsov and V. A. Shchukin, "*Novel Concepts for Injection Lasers*", Optical Engineering, Vol. 41 (12), pp. 3193–3203 (2002), which is incorporated herein by reference. Briefly, a tilted cavity laser is preferably designed such that a cavity is sandwiched between a bottom mirror and a top mirror. Both mirrors are preferably designed as multilayered mirrors. The major difference between a VCSEL and a TCL is that both the cavity and the mirrors in a TCL are in resonance to an optical mode, which propagate at a certain angle θ to the normal to the mirror planes.

There are many advantages to a tilted cavity laser. First, a tilted cavity laser may be used as both a surface emitting laser and an edge emitting laser. Second, the resonant conditions for the cavity and the mirrors are independent, thus providing a selection of both the angle θ and the wavelength of the emitted laser light. Third, the reflectivity of a tilted mode from a multilayered mirror is significantly higher than that of a vertical mode, which allows the device to reach the same high finesse of the cavity by using a mirror having a smaller number of layers and a smaller total thickness. Fourth, when a tilted cavity laser is used as a surface emitting laser, one of the preferred embodiments is such that the angle θ exceeds the angle of the total internal reflectance at the boundary between the semiconductor material of a cavity and the vacuum, and the emitted laser light is directly coupled via the near field to an optical fiber. This significantly reduces diffraction losses at the coupling to a fiber. Fifth, when a tilted cavity laser is used as an edge-emitting laser, it provides a strong wavelength stabilization of the emitted laser light. In a preferred embodiment of the present invention, at least part of the cavity of the TCL is formed by a method of the present invention.

Yet another embodiment of the present invention is a GaAs-based tilted cavity laser. This laser emits laser light at a wavelength in the wavelength region 1.4 to 1.8 μm and beyond.

An alternative embodiment of the present invention is a GaN-based edge-emitting laser, in which at least a part of the waveguide is made by using the method of the present invention. This laser emits laser light in the wavelength region from green light to ultraviolet light.

Another embodiment of the present invention is a GaN-based vertical cavity surface emitting laser. At least part of the cavity in the VCSEL is made by a method of the present invention. This laser emits laser light in the wavelength region from green light to ultraviolet light.

In yet another embodiment of the present invention, a GaN-based tilted cavity laser (TCL), in which at least a part of the cavity is made by a method of the present invention, emits laser light in the wavelength region from green light to ultraviolet light.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A semiconductor device comprising a substrate, a plastically relaxed layer grown on top of the substrate wherein a thickness of the plastically relaxed layer exceeds a critical thickness for plastic strain relaxation, and a defect-free layer grown on top of the plastically relaxed layer;

wherein at least a part of the device is manufactured by a method of fabrication of defect-free epitaxial layers on top of a surface of the plastically relaxed layer having a first thermal evaporation rate and a plurality of defects, wherein the surface comprises at least one defect-free surface region, and at least one surface region in a vicinity of the defects, the method comprising the steps of:

a) depositing a cap layer comprising a second material having a second thermal evaporation rate different from the first thermal evaporation rate, wherein the cap layer is selectively deposited on the defect-free surface region, such that at least one of the regions of the surface in the vicinity of the defects remains uncovered;

b) annealing a structure created in step a) at a temperature and duration such that at least one of the surface regions in the vicinity of the defects that is uncovered evaporates, while defect-free surface regions covered by the cap layer remain unaffected, and at least one annealed region is formed; and c) depositing a third material, latticematched or nearly lattice matched to the plastically relaxed layer, such that the third material overgrows both the cap layer and annealed regions of the plastically relaxed layer forming the defect-free-layer.

2. The semiconductor device of claim 1, wherein the device is selected from the group consisting of:
 a) a high electron mobility transistor;
 b) a field effect transistor;
 c) a heterojunction bipolar transistor; and
 d) an integrated circuit.

3. The semiconductor device of claim 1, wherein the device is selected from the group consisting of:
 a) a diode laser;
 b) a light-emitting diode;
 c) a photodetector;
 d) an optical amplifier;

e) a far infrared intraband detector;
f) an intraband far infrared emitter;
g) a resonant tunneling diode;
h) a solar cell; and
i) an optically bistable device.

4. The semiconductor device of claim 1, wherein the device is selected from the group consisting of:
a) a current-injection edge-emitting laser;
b) a vertical cavity surface emitting laser; and
c) a tilted cavity laser.

5. The semiconductor device of claim 1, wherein the plastically relaxed layer is a defectcontaining epitaxial layer.

6. The semiconductor device of claim 1, wherein at least one defect is a propagating defect selected from the group consisting of:
a) at least one threading dislocation;
b) at least one screw dislocation;
c) at least one stacking fault;
d) at least one antiphase boundary; and
e) any combination of a) through d).

7. The semiconductor device of claim 1, wherein the defects comprise at least one local defect which causes a propagating defect in a subsequently deposited epitaxial layer.

8. The semiconductor device of claim 7, wherein the local defect is selected from the group consisting of:
a) at least one local dislocation;
b) at least one misfit dislocation;
c) at least one local defect dipole;
d) at least one dislocation network;
e) at least one dislocation loop;
f) at least one dislocated cluster;
g) at least one impurity precipitate;
h) at least one oval defect;
i) a plurality of dirt particles on the surface; and
j) any combination of a) through i).

9. The semiconductor device of claim 1, wherein step (a) of the method comprises a deposition process selected from the group consisting of:
a) molecular beam epitaxy deposition;
b) metal-organic chemical vapor deposition; and
c) vapor phase epitaxy deposition.

10. The semiconductor device of claim 1, wherein step (c) of the method comprises a deposition process selected from the group consisting of:
a) molecular beam epitaxy deposition;
b) metal-organic chemical vapor deposition; and
c) vapor phase epitaxy deposition.

11. The semiconductor device of claim 1, wherein steps (a) and (b) of the method are repeated two times to twenty times.

12. The semiconductor device of claim 1, wherein steps (a) through (c) of the method are repeated two times to forty times.

13. The semiconductor device of claim 1, wherein the surface region in the vicinity of the defects differs from the defect-free surface region in a strain state, such that the cap layer is repelled from and does not cover the surface region in the vicinity of the defects.

14. The semiconductor device of claim 1, wherein the surface region in the vicinity of the defects differs from the defect-free surface region in a surface energy, such that the cap layer is repelled from and does not cover the surface region in the vicinity of the defects.

15. The semiconductor device of claim 1, wherein the surface region in the vicinity of the defects differs from the defect-free surface region in a surface stress, such that the cap layer is repelled from and does not cover the surface region in the vicinity of the defects.

16. The semiconductor device of claim 1, wherein the surface region in the vicinity of the defects differs from the defect-free surface region in a surface morphology, such that the cap layer is repelled from and does not cover the surface region in the vicinity of the defects.

17. The semiconductor device of claim 1, wherein the surface region in the vicinity of the defects differs from the defect-free surface region in wetting/non-wetting properties with respect to the deposition of the cap layer material, such that the cap layer is repelled from and does not cover the surface region in the vicinity of the defects.

18. The semiconductor device of claim 1, wherein an evaporation of the defect-containing regions is enhanced by chemical etching using a flux of chemically-active particles, wherein the chemically-active particles are selected from the group consisting of:
a) atoms;
b) molecules; and
c) ions.

19. The semiconductor device of claim 1, wherein an evaporation of the defect-containing regions is enhanced by a plasma etching process.

20. The semiconductor device of claim 1, wherein an evaporation of the defect-containing regions is enhanced by a wet etching process.

21. The semiconductor device of claim 1, wherein the thermal annealing in step (b) of the method results in the formation of troughs at a plurality of exits of the defects in the plastically relaxed layer.

22. The semiconductor device of claim 1, wherein the growth of the second epitaxial layer occurs in the lateral epitaxial overgrowth mode.

23. The semiconductor device of claim 22, wherein step (c) of the method comprises the substeps of:
a) starting growth of the third material at the surface regions covered by the cap layer;
b) continuing the growth of the third material in a lateral plane resulting in merging of neighboring domains of lateral epitaxial overgrowth; and
c) forming the defect-free layer from the third material, wherein the defect-free layer is suitable for further epitaxial growth.

24. The semiconductor device of claim 1, wherein at least one void remains in the third material.

25. The semiconductor device of claim 1, wherein no voids remain in the third material.

26. The semiconductor device of claim 1, wherein the method further comprises the step of, prior to step (a), the deposition of a fourth material, lattice-matched or nearly latticematched to the plastically relaxed layer, wherein the fourth material provides a repulsion of the second material of the cap layer from defect-containing surface regions.

27. The semiconductor device of claim 1, wherein the method further comprises the step of, prior to step (a), the deposition of a fourth material, wherein the fourth material is in a no-strain state lattice-mismatched to the plastically relaxed layer, wherein a thickness of the fourth material is below a critical thickness required for a creation of new defects, such that the fourth material forms a strained defect-free thin pseudomorphic layer.

28. The semiconductor device of claim 27, wherein the pseudomorphic layer provides a repulsion of the second material of the cap layer from defect-containing surface regions.

29. A semiconductor device comprising a substrate, a plastically relaxed layer grown on top of the substrate wherein a thickness of the plastically relaxed layer exceeds a critical thickness for plastic strain relaxation, and a defect-free layer grown on top of the plastically relaxed layer;
  wherein at least a part of the device is manufactured by a method of fabrication of defect-free epitaxial layers on a surface of the plastically relaxed layer, the method comprising the steps of:
  a) depositing the plastically relaxed layer having a first thermal evaporation rate, wherein the plastically relaxed layer is lattice-mismatched to a substrate, wherein a thickness of the plastically relaxed layer exceeds a critical thickness required for a formation of defects, such that a plurality of defects are formed in the plastically relaxed layer, wherein the surface of the plastically relaxed layer comprises at least one defect-free surface region, and at least one surface region in a vicinity of the defects;
  b) depositing a cap layer of a second material having a second thermal evaporation rate different from the first thermal evaporation rate, such that the cap layer is selectively deposited on the defect-free surface regions, and at least one of the surface regions in the vicinity of the defects remains uncovered;
  c) annealing a structure formed in step b) at a temperature and duration such that at least one of the surface regions in the vicinity of the defects that is uncovered evaporates, while defect-free surface regions covered by the cap layer remain unaffected, and at least one annealed region is formed; and
  d) depositing a third material, latticematched or nearly lattice matched to the first epitaxial layer, such that the third material overgrows both the cap layer and annealed regions of the first epitaxial layer, forming the defect-free layer suitable as a template for further epitaxial growth.

30. The semiconductor device of claim 1, wherein the device is a high electron mobility transistor and:
  a) the substrate is selected from the group consisting of a Si substrate and a GaAs substrate;
  b) the plastically relaxed layer is a plastically relaxed $Ga_{1-x}In_xAs$ layer; and
  c) the defect-free layer is a defect-free $Ga_{1-y}In_yAs$ layer.

31. The semiconductor device of claim 1, wherein the device is a high electron mobility transistor and:
  a) the substrate is selected from the group consisting of a Si substrate and a GaAs substrate;
  b) the plastically relaxed layer is a plastically relaxed $Ga_{1-x}In_xAs$ layer; and
  c) the defect-free layer is a defect-free $Ga_{1-y-z}In_yAl_zAs$ layer.

32. The semiconductor device of claim 1, wherein the device is a high electron mobility transistor and:
  a) the substrate is selected from the group consisting of a Si substrate with a surface orientation (111), a SjC substrate, and a sapphire substrate;
  b) the plastically relaxed layer is a plastically relaxed GaN layer; and
  c) the defect-free layer is a defect-free GaN layer.

33. The semiconductor device of claim 1, wherein the device is a high electron mobility transistor and:
  a) the substrate is selected from the group consisting of a Si substrate with a surface orientation (111), a SiC substrate, and a sapphire substrate;
  b) the plastically relaxed layer is a plastically relaxed $Ga_{1-x}In_xN$ layer; and
  c) the defect-free layer is a defect-free $Ga_{1-y}In_yN$ layer.

34. The semiconductor device of claim 1, wherein the device is an integrated circuit and:
  a) the substrate is a Si substrate;
  b) the plastically relaxed layer is a plastically relaxed $Si_{1-x}Ge_x$ layer;
  c) the defect-free layer is a defect-free $Si_{1-y}Ge_y$ layer;
  wherein the device further comprises a thin pseudomorphically strained Si layer .grown on top of the defect-free $Si_{1-y}Ge_y$ layer.

35. The semiconductor device of claim 1, wherein the device is a tilted cavity laser grown on an GaAs substrate, further comprising an epitaxial layer comprising a material selected from the group consisting of GaAs and $Ga_{1-z}Al_zAs$;
  wherein the plastically relaxed layer is a plastically relaxed $Ga_{1-x}In_xAs$ layer grown on top of the epitaxial layer;
  wherein the defect-free layer is a $Ga_{1-y}In_yAs$ layer grown on top of the plastically relaxed $Ga_{1-x}In_xAs$ layer; and
  wherein an n-part of a cavity comprises the epitaxial layer, the plastically relaxed layer, and the defect-free layer.

36. The device of claim 35, wherein the laser generates laser light in the wavelength region of 1.4 through 1.8 micrometers.

37. A GaN-based vertical cavity surface emitting laser comprising a cavity comprising a substrate, a plastically relaxed layer grown on top of the substrate wherein a thickness of the plastically relaxed layer exceeds a critical thickness for plastic strain relaxation, and a defect-free layer grown on top of the plastically relaxed layer, wherein at least a part of the cavity is made by a method comprising the steps of:
  a) depositing the plastically relaxed layer having a first thermal evaporation rate on the substrate, wherein the plastically relaxed layer is lattice-mismatched to the substrate, wherein a thickness of the plastically relaxed layer exceeds a critical thickness required for a formation of defects, such that a plurality of defects are formed in the plastically relaxed layer, such that a surface of said plastically relaxed layer comprises at least one defect-free surface region, and at least one surface region in a vicinity of the defects;
  b) depositing a cap layer of a second material having a second thermal evaporation rate different from the first thermal evaporation rate, such that the cap layer is selectively deposited on the defect-free surface regions, and at least one of the surface regions in the vicinity of the defects remains uncovered;
  c) annealing a structure formed in step b) at a temperature and duration such that at least one of the surface regions in the vicinity of the defects that is uncovered evaporates, while defect-free surface regions covered by the cap layer remain unaffected, and at least one annealed region is formed; and
  d) depositing a third material, latticematched or nearly lattice matched to the first epitaxial layer, such that the third material overgrows both the cap layer and annealed regions of the first epitaxial layer, forming the defect-free layer suitable as a template for further epitaxial growth.

38. The device of claim 37, wherein the laser generates laser light in a wavelength region from 100 nanometers to 600 nanometers.

39. A GaN-based edge-emitting laser comprising a waveguide comprising a substrate, a plastically relaxed layer grown on top of the substrate wherein a thickness of the plastically relaxed layer exceeds a critical thickness for plastic strain relaxation, and a defect-free layer grown on top of the plastically relaxed layer, wherein at least a part of the waveguide is made by a method comprising the steps of:

a) depositing the plastically relaxed layer having a first thermal evaporation rate on the substrate, wherein the plastically relaxed layer is lattice-mismatched to the substrate, wherein a thickness of the plastically relaxed layer exceeds a critical thickness required for a formation of defects, such that a plurality of defects are formed in the plastically relaxed layer, such that a surface of said plastically relaxed layer comprises at least one defect-free surface region, and at least one surface region in a vicinity of the defects;

b) depositing a cap layer of a second material having a second thermal evaporation rate different from the first thermal evaporation rate, such that the cap layer is selectively deposited on the defect-free surface regions, and at least one of the surface regions in the vicinity of the defects remains uncovered;

c) annealing a structure formed in step b) at a temperature and duration such that at least one of the surface regions in the vicinity of the defects that is uncovered evaporates, while defect-free surface regions covered by the cap layer remain unaffected, and at least one annealed region is formed; and d) depositing a third material, latticematched or nearly lattice matched to the plastically relaxed layer, such that the third material overgrows both the cap layer and annealed regions of the plastically relaxed layer, forming the defect-free layer suitable as a template for further epitaxial growth.

40. The device of claim 39, wherein the laser generates laser light in a wavelength region from 100 nanometers to 600 nanometers.

41. A GaN-based tilted cavity laser comprising a cavity comprising a substrate, a plastically relaxed layer grown on top of the substrate wherein a thickness of the plastically relaxed layer exceeds a critical thickness for plastic strain relaxation, and a defect-free layer grown on top of the plastically relaxed layer, wherein at least a part of the cavity is made by a method comprising the steps of:

a) depositing the plastically relaxed layer having a first thermal evaporation rate on the substrate, wherein the plastically relaxed layer is lattice-mismatched to the substrate, wherein a thickness of the plastically relaxed layer exceeds a critical thickness required for a formation of defects, such that a plurality of defects are formed in the plastically relaxed layer, such that a surface of said plastically relaxed layer comprises at least one defect-free surface region, and at least one surface region in a vicinity of the defects;

b) depositing a cap layer of a second material having a second thermal evaporation rate different from the first thermal evaporation rate, such that the cap layer is selectively deposited on the defect-free surface regions, and at least one of the surface regions in the vicinity of the defects remains uncovered;

c) annealing a structure formed in step b) at a temperature and duration such that at least one of the surface regions in the vicinity of the defects that is uncovered evaporates, while defect-free surface regions covered by the cap layer remain unaffected, and at least one annealed region is formed; and d) depositing a third material, latticematched or nearly lattice matched to the plastically relaxed layer, such that the third material overgrows both the cap layer and annealed regions of the plastically relaxed layer, forming the defect-free layer suitable as a template for further epitaxial growth.

42. The device of claim 41, wherein the laser generates laser light in the wavelength region from 100 nanometers to 600 nanometers.

* * * * *